(12) United States Patent
Ho et al.

(10) Patent No.: US 6,885,983 B1
(45) Date of Patent: *Apr. 26, 2005

(54) METHOD FOR AUTOMATICALLY SEARCHING FOR FUNCTIONAL DEFECTS IN A DESCRIPTION OF A CIRCUIT

(75) Inventors: Chian-Min Richard Ho, Mountain View, CA (US); Robert Kristianto Mardjuki, Danville, CA (US); David Lansing Dill, Redwood City, CA (US); Jing Chyuarn Lin, Sunnyvale, CA (US); Ping Fai Yeung, San Jose, CA (US); Paul Il Estrada, Los Alto, CA (US); Jean-Charles Giomi, Menlo Park, CA (US); Tai An Ly, Fremont, CA (US); Kalyana C. Mulam, San Jose, CA (US); Lawrence Curtis Widdoes, Jr., San Jose, CA (US); Paul Andrew Wilcox, Palo Alto, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 255 days.

This patent is subject to a terminal disclaimer.

(21) Appl. No.: 09/849,005

(22) Filed: May 4, 2001

Related U.S. Application Data

(63) Continuation of application No. 08/954,765, filed on Oct. 20, 1997, now Pat. No. 6,292,765.

(51) Int. Cl.[7] .............................................. G06F 17/50
(52) U.S. Cl. .......................... 703/14; 703/15; 703/16; 716/4
(58) Field of Search ........................... 703/13, 14, 15; 716/3, 4, 5; 714/30, 31

(56) References Cited

U.S. PATENT DOCUMENTS 5,202,889 A   4/1993   Aharon et al. ............... 714/739
5,479,414 A   12/1995  Keller et al. ................. 714/726

(Continued)

OTHER PUBLICATIONS

Mark Heinrich et al., "Hardware/Software Co–Design of the Stanford FLASH Multiprocessor", Proceedings of the IEEE, vol. 85, No. 3, Mar. 1997, pp. 455–466.

Singer, S. ; Vanetsky, L.; "Next Generation (NGTG) for Digital Circuits", Proceedings of IEEE Autotestcon, pp. 105–112, 1997.

(Continued)

*Primary Examiner*—Russell Frejd
(74) *Attorney, Agent, or Firm*—Silicon Valley Patent Group LLP

(57) ABSTRACT

A programmed computer searches for functional defects in a description of a circuit undergoing functional verification in the following manner. The programmed computer simulates the functional behavior of the circuit in response to a test vector, automatically restores the state of the simulation without causing the simulation to pass through a reset state, and then simulates the functional behavior of the circuit in response to another test vector. A predetermined rule can be used to identify test vectors to be simulated, and the predetermined rule can depend upon a measure of functional verification, including the number of times during simulation when a first state transition is performed by a first controller at the same time as a second state transition is performed by a second controller. During simulation of the test vectors, manually generated tests or automatically generated checkers can monitor portions of the circuit for defective behavior.

68 Claims, 15 Drawing Sheets

Microfiche Appendix Included
(1 Microfiche, 58 Pages)

U.S. PATENT DOCUMENTS

| | | | |
|---|---|---|---|
| 5,539,652 A | 7/1996 | Tegethoff | 364/490 |
| 5,555,270 A | 9/1996 | Sun et al. | 371/27 |
| 5,600,787 A | 2/1997 | Underwood et al. | 714/30 |
| 5,623,499 A | 4/1997 | Ko et al. | 395/500.06 |
| 5,630,051 A | 5/1997 | Sun et al. | 395/183.08 |
| 5,638,381 A | 6/1997 | Cho et al. | 371/22.4 |
| 5,654,657 A | 8/1997 | Pearce | 327/163 |
| 5,661,661 A | 8/1997 | Gregory et al. | 364/489 |
| 5,680,332 A | 10/1997 | Riami et al. | 703/13 |
| 5,729,554 A | 3/1998 | Weir et al. | 714/31 |
| 5,862,149 A | 1/1999 | Carpenter et al. | 371/22.3 |
| 6,175,946 B1 | 1/2001 | Ly et al. | 716/4 |
| 6,292,765 B1 * | 9/2001 | Ho et al. | 703/14 |
| 6,609,229 B1 | 8/2003 | Ly et al. | 716/4 |

OTHER PUBLICATIONS

Liang et al., "Identifying Invalid States for Sequential Circuit Test Generation", IEEE Trans. On Computer–Aided Design of Int. Circuits and Systems, vol. 16, Issue 9, pp. 1025–1033, Sep. 1997.

Liang et al., "Identifying Invalid States for Sequential Circuit Test Generation", Proc. Of the Fifth Asian Test Symposium 1996, pp. 10–15, Nov. 1996.

Camurati et al., "Efficient Verification of Sequential Circuits on a Parallel System", Proc. Third European Conference on Design Automation, pp. 64–68, Mar. 1992.

Kant et al., "Synthesizing Robust Data Structures—An Introduction", IEEE Trans. On Computers, pp. 161–173, 1990.

Caporossi et al., "Rule Checking at the Register Level", IEEE Spectrum, pp. 72–73, 1996.

Vinnakota et al., "Design of Multiprocessor Systems for Concurrent Error Detection and Fault Diagnosis", IEEE, pp. 504–511, 1991.

Benso, et al., "Exploiting HDLs for Circuits Fault Tolerance Assessments," IEEE, pp. 212–216, 1997.

Amato et al., "Checking Linked Data Structures", IEEE, pp. 164–173, 1994.

Devadas et al., "An Observability–Based Code Coverage Metric for Functional Simulation", IEEE 1996, pp. 418–425.

Vincentelli et al., "Verification of Electronic Systems,", 33$^{rd}$ Design Automation Conference, Las Vegas, Proceedings 1996, pp. 106–111.

K.L. McMillan, "Fitting Formal Methods into the Design Cycle", 31$^{st}$ ACM/IEEE 1994, pp. 314–319.

Ho et al., "Architecture Validation for Processors", Proceedings 22$^{nd}$ Annual Internationals, Symposium on Computer Architecture, Jun. 22–24, 1995, IEEE Computer Society, pp. 404–413.

Ho et al., "Validation Coverage Analysis for Complex Digital Designs", IEEE/ACM International Conference On Computer–Aided Design, Nov. 10–14, 1996, pp. 146–151.

Jones et al., "The Automatic Generation of Functional Test Vectors for Rambus Designs", 33$^{rd}$ Design Automation Conference IEEE Circuits & Systems Society, 1996.

Geist et al., "Coverage–Directed Test Generation Using Symbolic Techniques", pp. 142–158, First Int'l Conference FMCAD '96 Palo Alto, CA USA, Nov. 6–8, 1996 Proceedings.

Chian–Min Richard Ho, "Validation Tools For Complex Digital Designs", PhD Dissertation, Stanford University, Nov. 1996, pp. 6–15.

Windley, Phillip J., "Formal Modeling and Verification of Microprocessors", IEEE Transactions on Computers, vol. 44, No. 1, Jan. 1995, pp. 54–72.

Clarke, E. M., et al., "Efficient Generation of Counterexamples and Witnesses in Symbolic Model Checking", 32$^{nd}$ Design Automation Conference, Jun. 12–16, 1995, pp. 427–432.

Silburt, Allan, et al., "Accelerating Concurrent Hardware Design with Behavioral Modelling and System Simulation", 32$^{nd}$ Design Automation Conference, Jun. 12–16, 1995, pp. 528–533.

Jones, Robert C., et al., "Efficient Validity Checking for Processor Verification", IEEE International Conference on Computer–Aided Design, Nov. 5–9, 1995, pp. 2–6.

Clarke, Edmund M., et al., "Model Checking and Abstraction", ACM Press Conference Record of the Nineteenth Annual ACM SIGPLAN–SIGACT Symposium on Principles of Programming Languages, Jan. 19–22, 1992, pp. 343–354.

Aagaard, Mark D., et al, "The Formal Verification of a Pipelined Double–Precision IEEE Floating–Point Multiplier", 1995 IEEE/ACM International Conference on Computer–Aided Design, Nov. 5–9, 1995, pp. 7–10.

Clarke, E.M., "Representing Circuits More Efficiently in Symbolic Model Checking", 28$^{th}$ ACM/IEEE Design Automation Conference, Jun. 17–21, 1991, pp. 403–407.

Bombans, M., et al., "Design–Flow and Synthesis for ASICs: a case study", 32$^{nd}$ Design Automation Conference, Jun. 12–16, 1995, pp. 292–297.

Beer, Ilan, et al., "Methodology and System for Practical Formal Verification of Reactive Hardware", 6$^{th}$ International Conference, CAV '94, Jun. 21–23, 1994, Proceedings, pp. 183–193.

Daga, A., "A Symbolic–Simulation Approach to the Timing Verification of Interacting FSMs", International Conference on Computer Design: VLSI in Computers & Processors, Oct. 2–4, 1995, 584–589.

Matsunaga, Y., "An Efficient Equivalence Checker for Combinational Circuits", 33$^{rd}$ Design Automation Conference, Las Vegas, NV, 1996 Proceedings, pp. 629–634.

Balarin, F., et al., "Formal Verification of Embedded Systems, based on CFSM Networks", 33$^{rd}$ Design Automation Conference, Las Vegas, NV, 1996, 568–571.

Stornetta, T., et al., "Implementation of an Efficient Parallel BDD Package", 33$^{rd}$ Design Automation Conference, Las Vegas, NV, 1996, 641–644.

http://www.pure.com, Purify User's Guide, Version 4.0, believed to be prior to Oct. 1997.

DeMillo, Richard A., et al., "Software Testing and Evaluation", Software Engineering Research Center, Georgia Institute of Technolgy, 1997.

Groz, R., et al. "Attacking A Complex Distributed Algorithm from Different Sides: An Experience with Complementary Validation Tools", Proc. IFIP WG 6.1 Fourth International Workshop on Protocol Specification, Testing and Verification, Skyton Lodge Pennsylvania, Jun. 1984, pp. 315–331.

Nurie, G. "Attain Testability With Hiearchical Design", Electronic Design, Jun. 27, 1991, pp. 89–99.

Blum, M., et al., "Software Reliability via Run–Time Result–Checking", Proc. 35$^{th}$ IEEE FOCS, 1994.

Ho, Chian–Min Richard, "Validation Tools For Complex Digital Designs", A Dissertation Submitted to the Department of Computer Science and the Committee on Graduate Studies of Stanford University in Partial Fulfillment of Requirements For the Degree of Doctor of Philosophy, Nov. 1996.

Von Bochmann, G., "Concepts for Distributed Design", Springer–Verlag Berlin Heidelbeg New York, 1983.

Torku, K. E., "Fault Test Generation for Sequential Circuits: a Search Directing Heuristic", Ph.D. Thesis, University of Oklahoma, 1979.

Belt, J.E., "An Heuristic Search Approach to Test Sequence Generation for AHPL Described Synchronous Sequential Circuits", Ph.D. Thesis, University of Arizona, 1973.

http:www.parasoft.com, "Insure++ Getting Started Version 3.0.1", believed to be prior to Oct. 1997.

Huey, B. M., "Search Directing Heuristics for the Sequential Circuit Test Search System (SCIRTSS)", Ph.D. Thesis, University of Arizona, 1975.

Deutsch, M. S., "Software Verification and Validation", Prentice–Hall, Englewood Cliffs, NJ, 1982.

Masud, M., et al., "Functional Test Using Behavior Models", Digest of Papers COMPCON Spring 1992, San Francisco, CA Feb. 1992, pp. 446–451.

Brayton, R. K., et al., "VIS" First International Conference Formal Methods in Computer Aided Design, FMCAD'96, Palo Alto, CA, Nov. 1996, pp. 248–256.

Chandra, A. K., et al., "Architectural Verification of Processors Using Symbolic Instruction Graphs", Computer Science, Feb. 9, 1994, pp. 1–23.

Burch, Jerry R., et al., "Automatic Verification of Pipelined Microprocessor Control", Computer Aided Verification, $6^{th}$ International Conference, CAV '94, Stanford, CA, Jun. 21–23, 1994 Proceedings, pp. 69–80.

Malley, Charles, et al., "Logic Verification Methodology for Power PC™ Microprocessors", $32^{nd}$ Design Automation Conference, San Francisco, CA, Jun. 12–16, 1995, pp. 234–240.

Campos, S., et al., "Verifying the Performance of the PCI Local Bus using Symbolic Techniques", International Conference on Computer Design: VLSI in Computers & Processors, Oct. 2–4, 1995, Austin, Texas, pp. 72–78.

http://www.synopsys.com/pubs/JHLD/JHLD–099402, System Design and Validation, believed to be prior to Oct. 1997.

Beatty, Derek L., "Formally verifying a microprocessor using a simulation methodology", $31^{st}$ Design Automation Conference, San Diego, CA, Jun. 6–10, pp. 596–602.

Beer, Ilan, et al., "Rule–Base: an Industry–Oriented Formal Verification Tool", $33^{rd}$ Design Automation Conference, Proceedings, 1996, 655–660.

Bormann, Jorg, et al., "Model Checking in Industrial Hardware Design", $32^{nd}$ Design Automation Conference, San Francisco, CA, Jun. 12–16, 1995, pp. 298–303.

Hoskote, Y. V., et al., "Automatic Extraction of the Control Flow Machine and Application to Evaluating Coverage of Verification Vectors", International Conference on Computer Design: VLSI in Computers & Processors, Oct. 2–4, 1995, pp. 532–537.

Mihail, Milena, et al., "On the Random Walk Method for Protocol Testing", Computer Aided Verification, $6^{th}$ International Conference, CAV '94, Stanford, CA, Jun. 21–23, 1994, pp. 133–141.

Cheng, Kwang–Ting, "Automatic Generation of Functional Vectors Using the Extended Finite State Machine Model", $33^{rd}$ Design Automation Conference, Las Vegas, NV, Proceedings 1996, pp. 57–78.

Ramalingam, T., et al., "On conformance test and fault resolution of protocols based on FSM model", Proceedings of the IFIP TC6 Working Conference on Computer Networks, Architecture and Applications, Networks '92, Trivandrum, India Oct. 28–29, 1992, pp. 211–223.

Chechik, M., et al., "Automatic Verification of Requirements Implementation", Proc. 1994 International Symposium on Software Testing and Analysis (ISSTA), Seattle, WA, Aug. 1994, pp. 109–124.

v. Bochmann, G. et al., "Protocol Testing: Review of Methods and Relevance for Software Testing", ACM Press, Proceedings of the 1994 International Symposium on Software Testing and Analysis (ISSTA), Seattle, Washington, Aug. 17–19, 1994.

Fujiwara, S., et al., "Test Selection Based on Finite State Models", IEEE Transactions on Software Engineering, vol. 17, No. 6, Jun. 1991, pp. 591–603.

Forghani, B. et al., "Semi–automatic test suite generation from Estelle", Software Engineering Journal, Jul. 1992, pp. 295–307.

Fuchs, N. E., "Specifications are (preferably) executable", Software Engineering Journal, Sep. 1992, pp. 323–334.

Narasimhan, Naren, et al., "Specification of Control Flow Properties for Verification of Synthesized VHDL Designs", Formal Methods in Computer–Aided Design, First International Conference, FMCAD '96, Palo Alto, CA, Nov. 6–8, 1996, pp. 326–345.

Keutzer, K., "The Need for Formal Verification in Hardware Design and What Formal Verification Has Note Done for Me Lately", Workshop on the HOL Theorem Proving System and its Application, 1991, pp. 77–86.

Eiriksson, Asgeir T., "Integrating Formal Verification Methods with A Conventional Project Design Flow", $33^{rd}$ Design Automation Conference, Las Vegas, NV, Proceedings, 1996, pp. 666–671.

Borrione, D., et al., "HDL–Based Integration of Formal Methods and CAD Tools in the PREVAIL Environment", Formal Methods in Computer–Aided Design, First International Conference, FMCAD '96 Palo Alto, CA, Nov. 6–8, 1996, pp. 451–467.

Aziz, A., et al., "HSIS: A BDD–Based Environment for Formal Verification", $31^{st}$ Design Automation Conference, San Diego, CA, Jun. 6–10, 1994, pp. 454–459.

Behcet, S., et al., "A Test Design Methodology for Protocol Testing", IEEE Transactions on Software Engineering, vol. SE–13, No. 5, May 1987, pp. 518–531.

v. Bochman, G., "Usage of Protocol Development Tools: the Results of a Survey", Protocol IFIP WG 6.1, Seventh International Workshop on Protocol Specification, Testing and Verification, 1987, pp. 139–161.

Borgmann, J., et al., "Model Checking in Industrial Hardware Design", $32^{nd}$ Design Automation Conference, San Francisco, CA, Jun. 12–16, 1995, pp. 298–303.

Miczo, A.., "Digital Logic Testing and Simulation", John Wiley & Sons, New York, NY, 1986.

Naik, V. G., et al., "Modeling and Verification of a Real Life Protocol Using Symbolic Model Checking", Computer Aided Verification, $6^{th}$ International Conference, CAV '94, Stanford, CA Jun. 21–23, 1994, pp. 195–206.

Smith, S., et al., "Demand Driven Simulation: BACKSIM", 24th ACM/IEEE Design Automation Conference, Proceedings, 1987, pp. 181–187.

Levitt, J., et al., "A Scalable Format Verification Methodology for Pipelined Microprocessors", 33rd Design Automation Conference, Proceedings, 1996, pp. 558–563.

Burch, J. R., "Techniques for Verifying Superscalar Microprocessors", 33rd Design Automation Conference, Las Vegas, NV, Proceedings, 1996, pp. 552–557.

Jones, K. D., et al., "The Automatic Generation of Functional Test Vectors for Rambus Designs", 33rd Design Automation Conference, Las Vegas, NV, Proceedings, 1996, pp. 415–420.

Nelson, B. E., et al., "Simulation Event Pattern Checking with PROTO$^1$ ", Jun. 14, 1994.

Fallah, F., et al., Functional Vector Generation for HDL models Using Linear Programming and 3–Satisfiability, believed to be prior to Oct. 1997.

Moundanos, D., "Abstraction Techniques for Validation Coverage Analysis and Test Generation", IEEE Transactions on Computers, vol. 47, Jan. 1998, pp. 2–14.

Hsiao, M. S., et al., "Application of Genetically Engineered Finite–State–Machine Sequences to Sequential Circuit ATPG", IEEE Transactions on Computer–Aided Design of Integrated Circuits and Systems, vol. 17, No. 3, Mar. 1998, pp. 239–254.

Gregory, B., et al., "Method for processing a hardware independent user description to generate logic circuit elements including flip–flops, latches, and three–state buffers and combinations thereof", http://patent.womp.ent_number=5661661, believed to be prior to Oct. 1997.

Hastings, R., "Method for inserting new machine instructions into preexisting machine code to monitor preexisting machine access to memory", http://patent.womp...ent_number+5335344, believed to be prior to Oct. 1997.

Hastings, R., "Method and apparatus for modifying relocatable object code files and monitoring programs", http://patent.womp...ent_number=5535329, believed to be prior to Oct. 1997.

Cheng, K. T., "Automatic Functional Test Generation Using The Extended Finite State Machine Model", 30th Design Automation Conference, Dallas, Texas, Jun. 14–18, Proceedings, 1993, pp. 86–91.

Burch, J.R,. et al., "Symbolic Model Checking: $10^{20}$ States and Beyond", Information and Computation, 1998, pp. 142–170.

Keutzer, K., "The Need for Formal Methods for Integrated Circuit Design", Formal Methods in Computer–Aided Design, First International Conference, FMCAD '96, Palo Alto, CA, Nov. 6–8, 1996, pp. 1–19.

Devadas, S., et al., "An Observability–Based Code Coverage Metric for Functional Simulation", IEEE/ACM International Conference on Computer–Aided Design, Nov. 10–14, 1996, pp. 418–425.

Lewin, D., et al., "A Methodology for Processor Implementation Verification", Formal Methods in Computer–Aided Design, First International Conference, FMCAD '96, Palo Alto, CA, Nov. 6–8, 1996, pp. 126–143.

Aharon, A., et al., "Test Program Generation for Functional Verification of PowerPC Processors in IBM", 32nd Design Automation Conference, San Francisco, CA, Jun. 12–16, 1995, pp. 279–285.

Santucci, J., et al., "Speed up of Behavioral A.T.P.G. Using a Heuristic Criterion", 30th Design Automation Conference, Dallas, Texas, Jun. 14–18, 1993, pp. 92–96.

Abadir, M., et al., "Logic Design Verification via Test Generation", IEEE Transactions on Computer–Aided Design, vol. 7, No. 1, Jan. 1988, pp. 138–148.

Schlipf, T., et al., "Formal verification made easy", http://www.almaden...d/414/schlipf.html, believed to be prior to Oct. 1997.

Moore, J. S., "Introduction to the OBDD Algorithm for the ATP Community", Technical Report 84, Oct. 1992.

Bryant, R. E., "Binary Decision Diagrams and Beyond: Enabling Technolgies for Formal Verification", IEEE/ACM International Conference on Computer–Aided Design, San Jose, CA, Nov. 5–9, 1995, pp. 236–243.

Hoskote, Y. V., et al., "Automatic Verification of Implementations of Large Circuits Against HDL Specifications", IEEE Transactions on Computer–Aided Design of Integrated Circuits and Systems, vol. 16, No. 3, Mar. 1997, pp. 217–228.

Goel, P., "An Implicit Enumeration Algorithm to Generate Tests for Combinational Logic Circuits", IEEE Transactions on Computers, vol. C–30, No. 3, Mar. 1981, pp. 215–222.

Jones, R., et al., "Self–Consistency Checking", Formal Methods in Computer–Aided Design, First International Conference, FMCAD '96, Palo Alto, CA, Nov. 6–8, 1996, pp. 158–171.

Sajkowski, M., "Protocol Verification Techniques: Status Quo and Perspectives", Proc. IFIP WG 6.1 Fourth International Workshop on Protocol Specification, Testing and Verification, Skytop Lodge, Pennsylvania, Jun. 1984, pp. 697–720.

McMillan, K. L., "Fitting Formal Methods into the Design Cycle", 31st Design Automation Conference, San Diego, CA, Jun. 6–10, 1994, pp. 314–319.

Geist, D., et al., "Coverage–Directed Test Generation Using Symbolic Techniques", Formal Methods in Computer–Aided Design, First International Conference, FMCAD .96, Palo Alto, CA, Nov. 6–8, 1996, pp. 142–159.

Motohara, A., et al., "A State Traversal Algorithm Using a State Covariance Matrix", 30th Design Automation Conference, Dallas, Texas, Jun. 14–18, 1993, pp. 97–101.

Bryant, R. E., et al. "Formal Hardware Verification by Symbolic Ternary Trajectory Evaluation", 28th ACM/IEEE Design Automation Conference, San Francisco, CA, Jun. 17–21, 1991, pp. 397–420.

Coudert, O., et al., "Verification of Synchronous Sequential Machines Based on Symbolic Execution", Automatic Verification Methods for Finite State Systems, International Workshop, Grenoble, France, Jun. 12–14, 1989, pp. 365–373.

Sangiovanni–Vincentelli, A., "Verification of Electronic Systems,", 33rd Design Automation Conference, Las Vegas, NV, 1996, pp. 106–111.

Chandra, A. K., et al., "Constraint Solving for Test Case Generation", IEEE International Conference on Computer Design, 1992, pp. 245–248.

Chung, Pi–Yu, "Diagnosis and Correction of Logic Design Errors in Digital Circuits", 30th Design Automation Conference, Dallas, Texas, Jun. 14–18, 1993 pp. 503–508.

Chandra, A. K., "Architectural Verification of Processors Using Symbolic Instruction Graphs", IEEE International Conference on Computer Design, 1994, pp. 454–459.

Hastings, R., "System for Modifying relocatable object code files to monitor accesses to dynamically allocated memory", http://patent.womp...ent_number=5193180, believed to be prior to Oct. 1997.

Gately, J., "Verifying a Million–Gate Processor", Integrated System Design, Oct. 1997, pp. 19–23.

Factor, M., et al., "Rigorous Testing Using SnapShot", Israeli Conference on Computer Systems, and Software Engineering, Herzliya, Israel, Jun. 18–19, 1997, pp. 12–21.

Rundin, H., "Protocol Engineering: A Critical Assessment", Proceedings of the IFIP WG 6.1 Eighth International Symposium on Protocol Specification, Testing, and Verification Atlantic City, NJ, Jun. 7–10, 1998, pp. 5–16.

Stucki, L., et al., "New Assertion Concepts for Self–Metric Software Validation", International Conference on Reliable Software, Los Angeles, CA, Apr. 21–23, 1975, pp. 59–71.

Heimdahl, M., "Eperiences and Lessons from the Analysis of TCAS II", Software Engineering Notes, vol. 21, No. 3 (ISSTA), May 1996, pp. 79–83.

Dou, C. "Integration of SDL and VHDL for HW/SW Codesign of Communciation Systems,", $23^{rd}$ Euromicro Conference, Budapest, Hungary, Sep. 1–4, 1997, pp. 188–195.

Coen–Porisini, A., "Specification of Realtime Systems, Using Astral", IEEE Transactions on Software Engineering, vol. 23, No. 9, Sep. 1997, pp. 572–598.

Hamlet, R., "Theoretical Comparison of Testing Methods", Software Engineering Notes, vol. 14, No. 8, ACM SIGSOFT '89 Third Symposium on Software Testing Analysis, and Verification (TAV3), Key West, FL, Dec. 13–15, 1989, pp. 28–37.

Denney, R., "Test–Case Generation from Prolog–Based Specifications", *Software Testing*, Mar. 1991, pp. 49–57.

Monaco, J., "Functional Verification Methodology for the PowerPC 604™ Microprocessor", $33^{rd}$ Design Automation Conference, Las Vegas, NV, 1996, pp. 319–324.

Luckham, D., et al., "An Event–Based Architecture Definition Language", IEEE Transactions on Software Engineering, vol. 21, No. 9, Sep. 1995, pp. 717–734.

Rosenblum, D., "A Practical Approach to Programming With Assertions", IEEE Transactions on Software Engineering, vol. 21, No. 1, Jan. 1995, pp. 19–31.

Ho. R., et al., "Architecture Validation for Processors", $22^{nd}$ Annual International Symposium on Computer Architecture, Santa Margherita Liqure, Italy, Jun. 22–24, 1995, pp. 404–413.

Goering, R., "Startup zeroes in on tough logic bugs in verification twist", Electronic Engineering Times, Monday Jun. 1, 1998.

Ho, R., et al., "Validation Coverage Analysis for Complex Digital Designs", IEEE/AMC International Conference on Computer–Aided Design, San Jose, CA, Digest of Technical Papers, Nov. 10–14, 1996, pp. 146–151.

Gburzynski, P. et al., "LANSF: A Protocol Modelling Environment and its Implementation", Software Practice and Experience vol. 21(1), Jan. 1991, pp. 51–76.

Crowley, J. L., et al., "Issues is the Full Scale Use of Formal Methods for Automated Testing", Software Engineering Notes, International Symposium on Software Testing and Analysis, San Diego, CA, Jan. 8–10, 1996, pp. 71–78.

Offutt, A. J., et al., "An Experimental Evaluation of Data Flow and Mutation Testing", Software–Practice and Experience, vol. 26(2), Feb. 1996, pp. 165–176.

DeMillo, R. A., "An Extended Overview of the Mothra Software Testing Environment", Second Workshop on Software Testing, Verification, and Analysis, Banff, Canada, Jul. 19–21, 1988.

Clarke, E. M., et al., "Word Level Model Checking—Avoiding the Pentium FDIV Error", $33^{rd}$ Design Automation Conference, Las Vegas, NV, 1996, pp. 645–648.

Bryant, R. E., "Bit–Level Analysis of an SRT Divider Circuit", $33^{rd}$ Design Automation Conference, Las Vegas, NV, 1996, pp. 661–665.

Schnaider, B., et al., "Software Development in a Hardware Simulation Environment", $33^{rd}$ Design Automation Conference, Las Vegas, NV, 1996, pp. 684–689.

Smith, D. J., VHDL & Verilog Compared & Constrasted—Plus Modeled Example Written n VHDL, Verilog and C., $33^{rd}$ Design Automation Conference, Las Vegas, NV, 1996, pp. 771–776.

Knapp, D., et al., Behavioral Synthesis Methodology for HDL–Based Specification and Validation, $32^{nd}$ Design Automation Conference, San Francisco, CA Jun. 12–16, 1995, pp. 286–291.

Tomita, M., et al., "Rectification of Multiple Logic Design Errors in Multiple Output Circuits", $32^{rd}$ Design Automation Conference, San Diego, CA, 1994 pp. 212–217.

Kam, Timothy, et al., "Implicit State Minimization of Non-Deterministic FSM's", International Conference on Computer Design: VLSI in Computers & Processors, Austin, TX, Oct. 2–4, 1995, pp. 250–257.

Bryant, R. E., et al., "Verification of Arithmetic Circuits with Binary Moment Diagrams", $32^{nd}$ Design Automation Conference, San Francisco, CA, Jun. 12–16, 1995, pp. 535–541.

Ly, Tai, "Scheduling Using Behavioral Templates", $32^{nd}$ Design Automation Conference, San Francisco, CA, Jun. 12–16, 1995, pp. 101–106.

Grayson, B., et al., "Statistics on Concurrent Fault and Design Error Simulation", International Conference on Computer Design: VLSI in Computers & Processors, Austin, TX, Oct. 2–4, 1995, pp. 622–627.

Swamy, G., et al., "Incremental Methods for FSM Traversal", International Conference on Computer Design: VLSI in Computers & Processors, Austin, TX, Oct. 2–4, 1995, pp. 590–595.

Cyrluk, D. A., et al., "Theorem Proving: Not an Esoteric Diversion, but the Unifying Framework for Industrial Verification", International Conference on Computer Design: VLSI in Computers & Processors, Austin, TX, Oct. 2–4, 1995, pp. 538–544.

Swamy, G. M., et al., "Incremental Formal Design Verification, IEEE/ACM International Conference on Computer–Aided Design", San Jose, CA, Nov. 6–10, 1994, pp. 458–465.

Butler, K. M., "Heuristics to Computer Variable Orderings for Efficient Manipulation of Ordered Binary Decision Diagrams", $28^{th}$ ACM/IEEE Design Automation Conference, San Francisco, CA, Jun. 17–21, 1991, pp. 417–420.

Rudnick, E. M., et al., "Sequential Circuit Test Generation in a Genetic Algorithm Framework", $31^{st}$ Design Automation Conference, San Diego, CA, Jun. 6–10, 1994, pp. 698–704.

Wing, J. M., "A Specifier's Introduction to Formal Methods", Computer, vol. 23, No. 9, Sep. 1990, pp. 8–24.

Keen, J. "Specification for Duplo SNaC RLT Assertion Language", Dec. 6, 1996.

Golson, S., "State Machine Design Techniques for Verilog and VHDL", http://www.synopsys.com/pubs/JHLD/JHLD-099401, believed to be prior to Oct. 1997.

Schroeder, S., "Turning to Formal", Integrated System Design, Sep. 1987, pp. 15–20.

Panda, S., et al., "Symmetry Detection and Dynamic Variable Ordering of Decision Diagrams", IEEE/ACM International Conference on Computer–Aided Design, Nov. 6–10, 1994, pp. 628–631.

Iwashita, H., et al., "CTL Model Checking Based on Forward State Traversal", IEEE/ACM International Conference on Computer–Aided Design, San Jose, CA, Nov. 6–10, 1996, pp. 82–87.

Hojati, R., et al., "Verification Using Uninterpreted Functions and Finite Instantiations" Formal Methods in Computer–Aided Design, Frist International Conference FMCAD '96, Palo Alto, CA Nov. 6–8, 1996, pp. 218–233.

Narayan, A., et al., "Partitioned ROBDDs—A Compact, Canonical and Efficiently Manipulable Representation for Boolean Functions", IEEE/ACM International Conference on Computer–Aided Design, Nov. 6–10, 1996, pp. 547–554.

Zhou, A., "Formal Verification of the Island Tunnel Controller Using Miltiway Decision Graphs", Formal Methods in Computer–Aided Design, First International Conference, FMCAD '96, Palo Alto, CA, Nov. 6–8, 1996, pp. 218–232.

Lee, W., et al., "Tearing Based Automatic Abstraction for CTL, Model Checking"San Jose, CA, Nov. 10–14, 1996, pp. 76–81.

Ravi, Kavita, et al., "High–Density Reachability Analysis", IEEE/ACM International Conference on Computer–Aided Design, San Jose, CA, Nov. 5–9, 1995, pp. 154–158.

Cho, H., et al., "A Structural Approach to State Space Decomposition for Approximate Reachability Analysis", IEEE International Conference on Computer Design: VLSI in Computers and Processors, Cambridge, MA, Oct. 10–12, 1994, pp. 236–239.

Cho, H., et al., "A State Space Decomposition Algorithm for Approximate FSM Traversal", IEEE, 1994, pp. 137–141.

Cho, H., et al., "Algorithms for Approximate FSM Traversal", $30^{th}$ ACM/IEEE Design Automation Conference, 1993, pp. 25–30.

Butler, R. W., et al., "The Infeasibility of Quantifying the Reliability of Life–Critical Real–Time Software" believed to be prior to 1997.

Woods, S., et al., "Efficient Solution of Systems of Boolean Equations", IEEE/ACM International Conference on Computer–Aided Design, San Jose, CA, Nov. 10–14, 1996, pp. 542–546.

Cabodi, G., et al., "Improved Reachability Analysis of Large Finite State Machines", IEEE/ACM International Conference on Computer–Aided Design, San Jose, CA, Nov. 10–14, 1996, pp. 354–360.

Ganapathy, G., et al., "Hardware Emulation for Functional Verification of K5", $33^{rd}$ Design Automation Conference, Las Vegas, NV, 1996, pp. 315–318.

Sawant, S., et al., "RTL Emualtion: The Next Leap in System Verification", $33^{rd}$ Design Automation Conference, Las Vegas, NV, 1996, pp. 233–235.

Daga, A. J., et al., "The Minimization and Decomposition of Interface State Machines", $31^{st}$ Design Automation Conference, San Diego, CA, Jun. 6–10, 1994, pp. 120–125.

Narayan, S., et al., "Interfacing Incompatible Protocols using Interface Process Generation", $32^{nd}$ Design Automation Conference, San Francisco, CA, Jun. 12–16, 1995, pp. 468–473.

Monohan, Chuck, et al., "Symbolic Modeling and Evaluation of Data Paths", $32^{nd}$ Design Automation Conference, San Francisco, CA, Jun. 12–16, 1995, pp. 389–394.

Marculescu, D., et al., "Stochastic Sequential Machine Synthesis Targeting Constrained Sequence Generation", $33^{rd}$ Design Automation Conference, Las Vegas, NV, 1996, pp. 696–701.

Verlind, E., et al., "Efficinet Partial Enumeration for Timing Analysis of Asynchronous Systems", $33^{rd}$ Design Automation Conference, Las Vegas, NV, 1996, pp. 55–58.

Popescu, V. et al., "Innovative Verification Strategy Reduces Design Cycle Time For High–End SPARC Processor", $33^{rd}$ Design Automation Conference, Las Vegas, NV, 1996, pp. 311–314.

Casaubieilh, F., et al., "Functional Verification Methodology of Chameleon Processor", $33^{rd}$ Design Automation Conference, Las Vegas, NV, 1996, pp. 421–426.

Brown, S., et al., "Experience in Designing a Large–scale Multiprocessor using Field Programmable Devices and Advanced CAD Tools", $33^{rd}$ Design Automation Conference, Las Vegas, NV, 1996, pp. 427–432.

Norris, C., "State Reduction Using Reversible Rules", $33^{rd}$ Design Automation Conference, Las Vegas, NV, 1996, pp. 564–567.

Sanghavi, J., et al., "High Performance BDD Package By Exploiting Memory Hierarchy", $33^{rd}$ Design Automation Conference, Las Vegas, NV, 1996, pp. 635–640.

Meyer, W., et al., "Design and Synthesis of Array Structured Telecommunication Processing Applications", $34^{th}$ Design Automation Conference, Anaheim, CA, Jun. 9–13, 1997, pp. 486–491.

Seawright, A., et al., "A System for Compiling and Debugging Structured Data Processing Controller", EURO, Design Automation Conference, 1996.

Data Sheet ATC's CoverMeter™ USA Commercial Price List, 1996.

Dill, D. L., et al., "Acceptance of Formal Methods: Lessons From Hardware Design", Computer, Apr. 1996, pp. 23–24.

Bullis, D., "Verification and Modeling for Synthesis–Based Design", Marketing Communications, believed to be prior to 1997, pp. 15–17.

Article "Product expectations in networking have risen to a point where systems must be self–correcting. The added cost of 'safe' design practices is not even questioned", Electronic Engineering Times, Nov. 11, 1996, p. 48.

Young, L. H., "Building A Better Bug Trap", Electronic Business Today, Nov. 1996, pp. 49–53.

Silbey, A. "The Systems Challenge for EDA Tools" Viewlogic Systems, believed to be prior to Oct. 1997, pp. 22–26.

Singer, S., et al., "Next Generation Test Generator (NGTG) for Digital Circuits", Autotestcon, 97. 1997 IEEE Autotestcon Proceedings, Sep. 22–25, 1997, pp. 105–112.

* cited by examiner

81 Write into at least a majority of storage elements of the circuit the values held in Current State

82 Force each "Previous Value Register " to hold the value of first storage element in state prior to Current State

83 Force each "Asynchronous Mux Select Register" to the value that causes "Mux" to select its input from the "Previous Value Register"

84 Force the simulation to proceed for a non-zero time period.
(Time period is a small fraction of the simulation cycle period).

85 Force each "Asynchronous Mux Select Register" to the value that causes "Mux" to select its input from first storage element

METHOD FOR AUTOMATICALLY SEARCHING FOR FUNCTIONAL DEFECTS IN A DESCRIPTION OF A CIRCUIT

CROSS-REFERENCE TO RELATED APPLICATION

This application is a continuation of U.S. patent application Ser. No. 08/954,765, filed Oct. 20, 1997, now U.S. Pat. No. 6,292,765. In addition, this application is related to and incorporates by reference herein in its entirety the concurrently filed, commonly owned U.S. patent application Ser. No. 08/955,329, now U.S. Pat. No. 6,175,946, filed by Tai An Ly, et al., and entitled "A Method for Automatically Generating Checkers for Finding Functional Defects in a Description of a Circuit".

CROSS-REFERENCE TO MICROFICHE APPENDICES

Microfiche appendices 1–58 (of 89 sheets and 4.945 frames) that are attached hereto contain source code in C language for programming a computer, are a part of the present disclosure, and are incorporated by reference herein in their entirety.

A portion of the disclosure of this patent document contains material which is subject to copyright protection. The copyright owner has no objection to the facsimile reproduction by anyone of the patent document or the patent disclosure, as it appears in the patent and trademark office patent files or records, but otherwise reserves all copyright rights whatsoever.

FIELD OF THE INVENTION

The present invention relates generally to a method implemented by a programmed computer for verifying the functionality of digital circuits during development and testing. More specifically, the invention relates to an automated method for searching for functional defects in a description of a circuit-under-verification.

BACKGROUND OF THE INVENTION

Modern digital electronic circuits are typically designed at the register-transfer (RTL) level in hardware description languages such as Verilog (see "The Verilog Hardware Description Language", Third Edition, Don E. Thomas and Philip R. Moorby, Kluwer Academic Publishers, 1996) or VHDL (see "A Guide to VHDL", Stanley Mazor and Patricia Langstraat, Kluwer Academic Publishers, 1992). A circuit description in such a hardware description language can be used to generate logic circuit elements as described, for example, in U.S. Pat. No. 5,661,661 granted to Gregory and Segal.

Such hardware description languages facilitate extensive simulation and emulation of the described circuit using commercially available products such as Verilog-XL available from. Cadence Design Systems, San Jose, Calif., QuickHDL available from Mentor Graphics, Wilsonville, Oreg., Gemini CSX available from IKOS Systems, Cupertino, Calif., and System Realizer available from Quickturn Design Systems, Mountain View, Calif. These hardware description languages also facilitate automatic synthesis of ASICs (see "HDL Chip Design", by Douglas J. Smith, Doone Publications, 1996; "Logic Synthesis Using Synopsys", Pran Kurup and Taher Abbasi, Kluwer Academic Publishers, 1997) using commercially available products such as Design Analyzer and Design Compiler, available from Synopsys, Mountain View, Calif.

As described in "Architecture Validation for Processors", by Richard C. Ho, C. Han Yang, Mark A. Horowitz and David L. Dill, Proceedings $22^{nd}$ Annual International Symposium on Computer Architecture, pp. 404–413, June 1995, "modern high-performance microprocessors are extremely complex machines which require substantial validation effort to ensure functional correctness prior to tapeout" (see page 404). As further described in "Validation Coverage Analysis for Complex Digital Designs" by Richard C. Ho and Mark A. Horowitz, Proceedings 1996 IEEE/ACM International Conference on Computer-Aided Design, pp. 146–151, November 1996, "the functional validation of state-of-the-art digital design is usually performed by simulation of a register-transfer-level model" (see page 146).

It is well known to monitor the operation of a simulation test by using, for example, "snoopers" generated manually as described at page 463, column 2, in "Hardware/Software Co-Design of the Stanford FLASH Multiprocessor", by Mark Heinrich, David Ofelt, Mark A. Horowitz, and John Hennessy, Proceedings of the IEEE, Vol 85, No. 3, pp. 455–466, March 1997, and in "Functional Verification Methodology for the PowerPC 604 Microprocessor", by James Monaco, David Holloway and Rajesh Raina, Proceedings $33^{rd}$ IEEE Design Automation Conference, pp. 319–324, June 1996.

Another prior art system monitors the operation of a simulation test by using a "golden model" that is "written without reference to the RTL" and is "co-simulated using the same set of test vectors", as described by Chian-Min Richard Ho, in "Validation Tools for Complex Digital Designs", Ph. D. Dissertation, Stanford University Computer Science Department, November 1996 (at page 6, Section 2.1).

Prior-art products (for example, see the "Purify" product from Pure Atria, Sunnyvale, Calif., and the "Insure++" product from ParaSoft, Monrovia, Calif.) exist for testing software programs that may be written, for example in the programming language "C" described by Brian W. Kernighan and Dennis M. Ritchie in the book "The C Programming Language", Second Edition, PTR Prentice Hall, 1988. See "Purify User's Guide, Version 4.0", Pure Atria Corporation, 1996, and "Insure++Automatic Runtime Debugger User's Guide", ParaSoft Corporation, 1996.

BRIEF DESCRIPTION OF THE DRAWINGS

FIG. 3G illustrates, in a flow chart, substeps performed in one implementation of step 4 in FIG. 3A.

SUMMARY

Figure 1A:
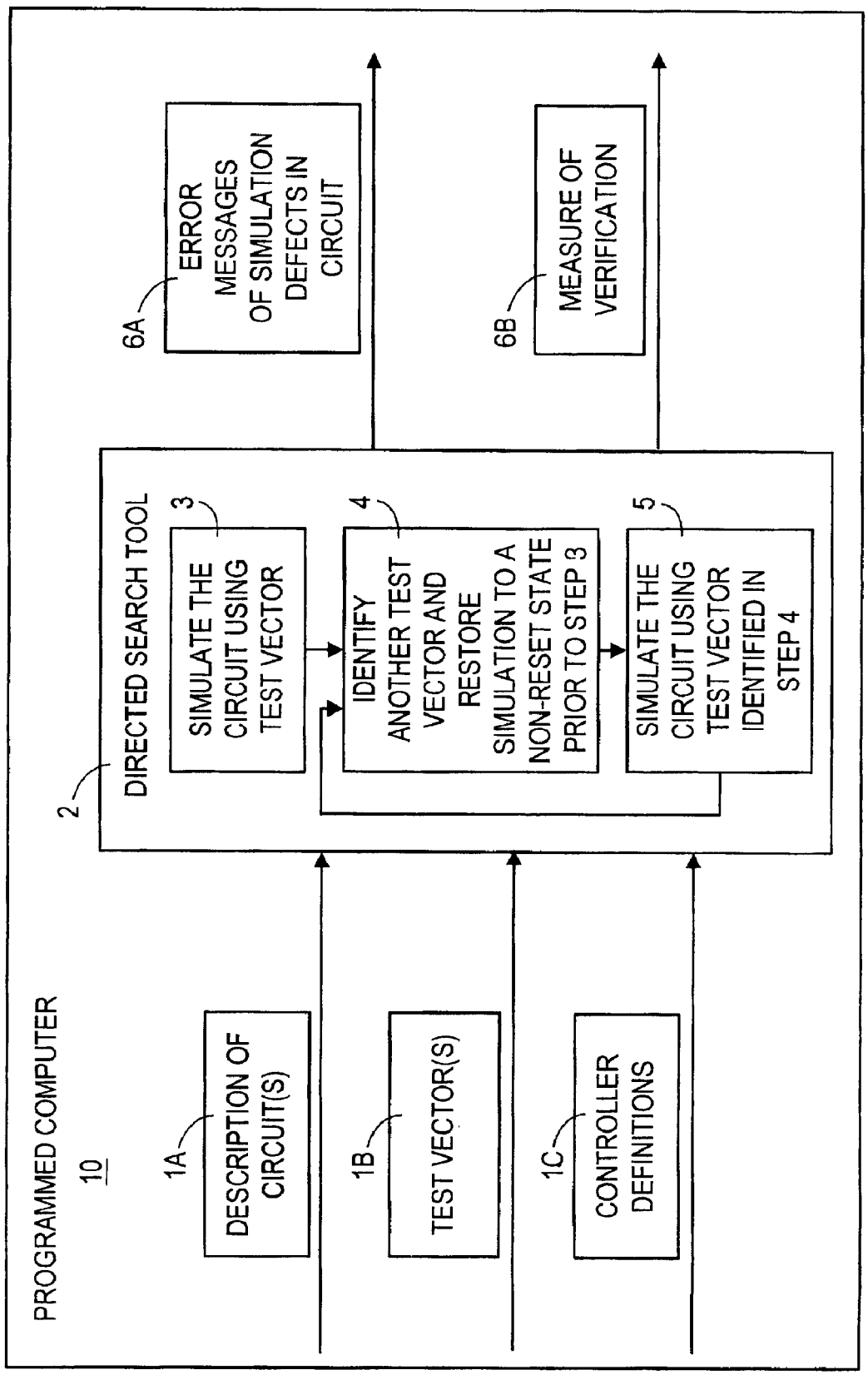
FIG. 1A illustrates, in a data flow diagram, use of a directed search tool of this invention that searches for functional defects in a description of a circuit.

A computer, when programmed in accordance with the invention performs the following steps: (1) simulates the functional behavior of a circuit (also called "circuit-under-verification") using one or more test vectors (e.g. complete sets of signals at the input terminals of the circuit), (2) automatically restores the simulation to a current state (described below), and (3) simulates the functional behavior of the circuit with one or more additional test vectors. The current state is represented, for example, by the set of signals in all storage elements of the circuit prior to the first simulating step. The current state is different from the reset state (described below), and can be attained, for example, by simulating a sequence of other test vectors.

In one embodiment, the programmed computer repeats the steps of automatically restoring and simulating until all test vectors in a group (obtained by applying a predetermined rule) have been used in the simulation. As an example, if the current state of simulation results from a pipeline stall, the programmed computer can cause the simulation to successively transition to multiple states that can occur immediately after the pipeline stall by repeating the steps of (1) automatically restoring the state resulting from the pipeline stall and (2) simulating with a different test vector.

During the step of automatically restoring, the programmed computer does not cause the simulation to pass through a "reset state" (i.e. a state of the simulation in response to a simulated reset signal applied to the circuit). In one embodiment, the programmed computer implements the step of automatically restoring by directly loading signal values of the current state into the simulated storage elements. Specifically, prior to simulation with the first test vector, the programmed computer reads and saves the current state. Thereafter, during the step of automatically restoring, the programmed computer directly loads the saved signal values into the storage elements, thereby to automatically restore the simulation directly to the current state. In another embodiment, the programmed computer implements the step of automatically restoring by restoring a state which is different from the current state and then using a sequence of test vectors to cause the simulation to transition to the current state through one or more states which are not reset states.

By use of the step of automatically restoring as described herein to return to the current state, the computer can be programmed to successively simulate multiple next states that are reachable from the current state by using different test vectors. Specifically, in one embodiment, the computer is programmed to use a predetermined rule to select a group of next states from the set of all possible next states and then to identify the test vectors that can cause the simulation to transition from the current state to each state in the selected group. When applying the predetermined rule, the programmed computer preferably uses a measure of functional verification of the circuit to select the group of next states.

In another embodiment, the computer is programmed to use a predetermined rule to identify test vectors with certain specific properties, for example, test vectors which set specific input pins of the circuit to specific values, e.g. 0.

In still another embodiment, the computer is programmed to simulate a randomly generated test vector after each step of automatically restoring, in this case, the programmed computer does not use a predetermined rule to identify a test vector.

In a first example, the circuit-under-verification includes a "controller" (i.e. a subcircuit) having a number of states, and the measure of verification identifies the states of the controller that have been reached in simulation. The programmed computer selects, as the group of next states, the states of the controller that have yet to be reached.

In a second example, the circuit-under-verification includes two controllers respectively capable of performing first state transitions, and second state transitions. The programmed computer selects as the group of next states the states that require performance of a pair of first and second state transitions that have not previously been performed simultaneously at least once. Identifying test vectors based on such un-exercised pairs of state transitions increases functional verification of interactions between the two controllers. Specifically, the programmed computer finds functional defects that result from unusual interactions between two controllers, such as synchronization errors, resource conflicts, and "one-cycle-off" problems that are not normally detected by prior art methods.

The method of automatically restoring a current simulation state before applying a new test vector has additional advantages over the prior art method of sequentially applying test vectors. Specifically, in the prior art method, many of test vectors that are simulated result in repetition of behaviors which have already been exercised, thus they do not result in new behaviors of the circuit being exercised, and they do not result in finding new functional defects. Using the capability of directly and automatically restoring the simulation to a specific state, many test vectors can be efficiently simulated starting from a set of preferred states where new behaviors can be exercised using selected test vectors.

In one embodiment, the programmed computer automatically generates descriptions of additional circuits (hereinafter "checkers") that monitor portions of the circuit-under-verification, and flag behaviors of the portions in conformance with known defective behaviors. During simulation, each checker is coupled to an instance of an arrangement of circuit elements associated with a defective behavior. Each checker monitors signals flowing to and from the instance and generates an error message on detecting the known defective behavior.

Use of automatically generated checkers in combination with automatic state restoration and simulation as described herein has several advantages. Specifically, the checkers flag an error as soon as the error occurs in simulation, emulation, or in a semiconductor die, because each checker monitors defective behavior of one instance of an arrangement in the circuit. Therefore, diagnosing errors flagged by automatically generated checkers is much easier than diagnosing errors flagged by end-to-end tests. Furthermore, functional verification can be terminated as soon as an error message is generated, thereby eliminating the generation and diagnosis of additional error messages (generated by continuing the functional verification). Hence, use of checkers as described herein eliminates the prior art need to simulate after an error occurs (e.g. in some cases for several hours) until an effect of the error is detected by an end-to-end test.

DETAILED DESCRIPTION

A computer 10 (FIG. 1A), when programmed by software (hereinafter "directed search tool") in accordance with this invention: simulates the functional behavior of a circuit (also called "circuit-under-verification") using a test vector (as illustrated by step 3), automatically restores simulation to a non-reset state (as illustrated by step 4), and simulates the functional behavior using another test vector (as illustrated by step 5). Computer 10 receives as inputs a description of the circuit-under-verification (e.g. in file 1A) and a test vector (e.g. in file 1B), and generates error messages (e.g. in file 6) describing functional defects found during simulation. Files 1A and 1B have a description of circuitry and signal values similar or identical to prior art descriptions of circuitry and test vectors, for example, as described in the above-referenced "Validation Tools for Complex Digital Designs", by Ho.

Hereinafter, all references to a directed search tool are intended to mean an appropriately programmed computer. Such a programmed computer 10 is preferably a workstation computer that includes memory (e.g. 512 MB of random access memory), and central processing unit (CPU) of the type well known to a person skilled in the art of electronic design automation. Moreover, simulation of the functional behavior of a circuit is sometimes described herein as simply simulation of the circuit. Such simulation can be performed by programming computer 10 with simulation software, such as Verilog-XL available from Cadence Design Systems, San Jose, Calif., QuickHDL available from Mentor Graphics, Wilsonville, Oreg., and Gemini CSX available from IKOS Systems, Cupertino, Calif.

Figure 1B:
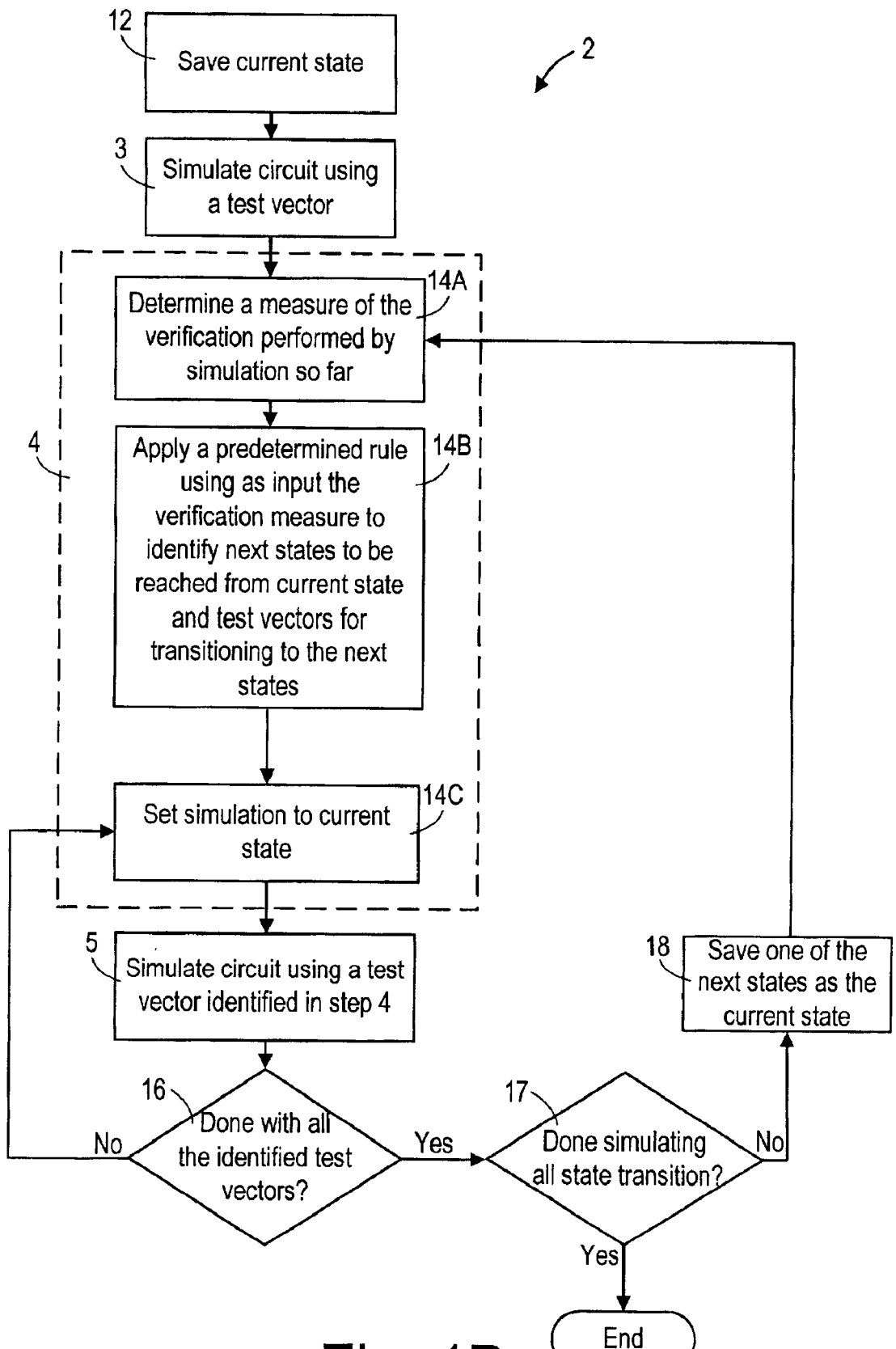
FIG. 1B illustrates, in a flow chart, steps performed by one particular implementation of the directed search tool of FIG. 1A.
Figure 1C:
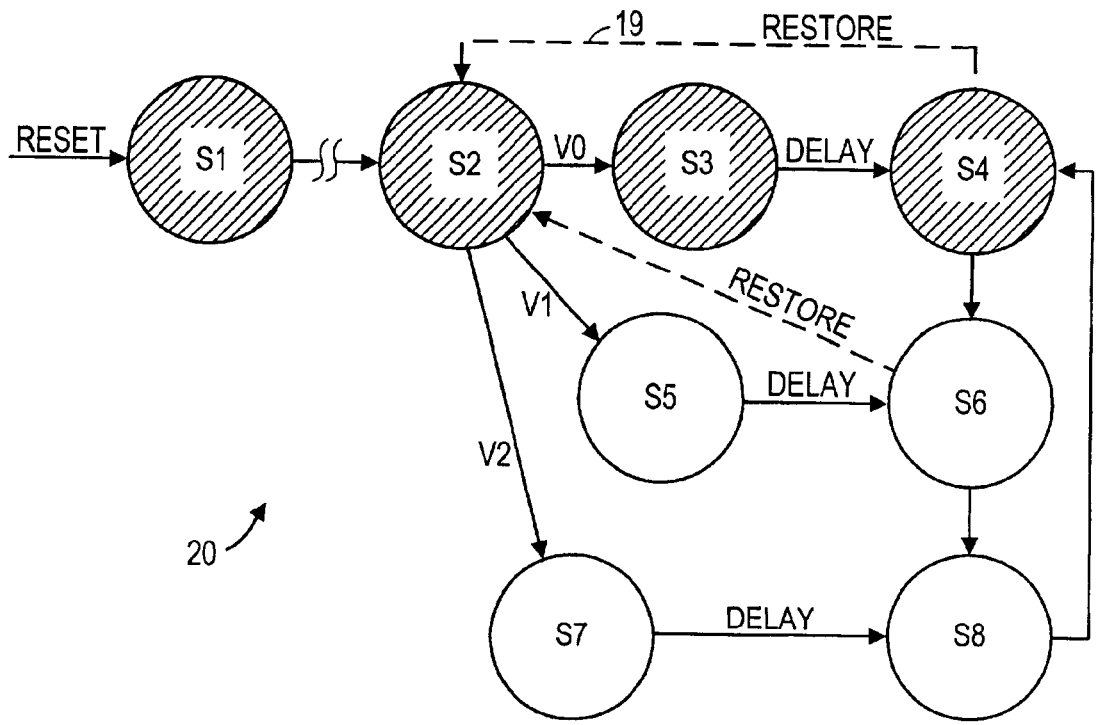
FIG. 1C illustrates, in a state diagram, transitions between various states of a circuit under simulation.

In one embodiment, directed search tool 2 (FIG. 1B) simulates a circuit having a single controller, e.g. controller 20 that has eight states S1–S8 (FIG. 1C). Directed search tool 2 identifies controller 20 in the circuit's description (e.g. in file 1A) in response to a directive in file 1C, for example, the directive $OIn_init_search_group ("controller_20_state_var")

which identifies "controller 20 state_var" as a state variable. As there is only controller 20 in the circuit-under-verification, in the following description the same eight states S1–S8 are also used to identify the state of the simulation.

Figure 1D:
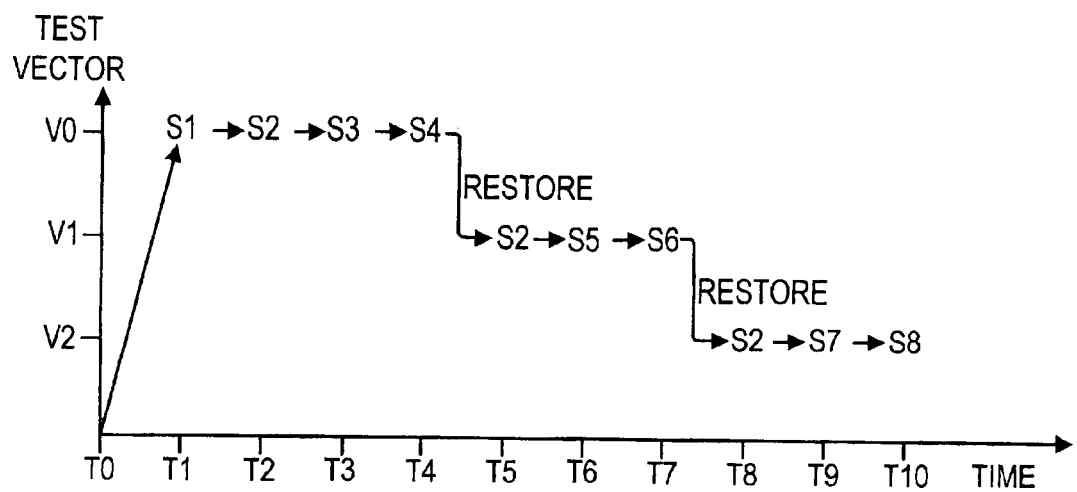
FIG. 1D illustrates, in a graph of time versus use of test vectors, a simulation sequence of state transitions of FIG. 1C during performance of the method illustrated in FIG. 1B.

Controller 20 has a reset state S1 that is the state of simulation at time T1 (FIG. 1D) in response to reset at time T0. The simulation transitions from state S1 to state S2 at time T2, for example in response to a test vector (e.g. in file 1B) provided by the user. Alternatively, a user can simply change the state of simulation, i.e. overwrite state S1 with state S2. Thereafter, directed search tool 2 saves (in step 12) the current state S2, and simulates (in step 3) the circuit (e.g. described in file 1A) using a test vector V0 (e.g. in file 1B). In response to the test vector V0, the simulation transitions from state S2 to state S3 at time T3, and automatically to state S4 after a delay, e.g. at time T4 (FIG. 1D).

Thereafter, directed search tool 2 performs a step 4 (FIG. 1B) that includes substeps 14A–14C, in this particular implementation. In substep 14A, directed search tool 2 determines a measure of the functional verification completed in prior steps. For example, directed search tool 2 determines that states S1–S4 (shown hatched in FIG. 1C) have been simulated in prior steps. In substep 14B, directed search tool 2 uses the measure of functional verification (e.g. the simulated states S1–S4) to identify the next states that can be reached from the current state (e.g. state S2) but have not been simulated in prior steps. In this particular example, directed search tool 2 enumerates all possible states S1–S8 and then determines that the group of next states includes non-simulated states S5–S8 (FIG. 1C). Next, in the same substep 14B, directed search tool 2 applies a predetermined rule and identifies one or more test vectors required to transition from the current state S2 to one or more of next states S5–S8 (see FIG. 1C). In this particular example, directed search tool 2 finds (e.g. by checking the effect of all valid input values on the circuit in the current state) a first test vector V1 (see FIG. 1D) required to transition from state S2 to state S5, and a second test vector V2 required to transition from state S2 to state S7. Thereafter, in substep 14D, directed search tool 2 sets the simulation at time T5 (FIG. 1D) to the current state S2 that was saved in step 12, e.g. writes the value representing S2 into storage elements that hold the state of simulation (as illustrated by a dashed arrow 19 in FIG. 1C).

Then, directed search tool 2 simulates (see step 1 in FIG. 1B) the circuit using test vector V1 that was identified in step 14 (FIG. 1B). Next, directed search tool 2 checks (see step 16) whether all of test vectors V1 and V2 (identified in step 4) have been used, and if not returns to step 4 (i.e. to substep 14C), and uses the remaining test vector V2 at time T8 (FIG. 1D). If all of test vectors V1 and V2 have been used (e.g. at time T10), and all state transitions have been is simulated, directed search tool 2 stops the simulation (see step 17 in FIG. 1B).

Directed search tool 2 simulates behavior of controller 20 (as identified in file 1C) in states S5 and S7 that would otherwise not have been simulated by use of test vector V0 (in file 1B). Specifically, when controller 20 reaches state S4, it can proceed only to states S6 and S8. Controller 20 transitions to states S5 and S7 only from state S2, and cannot reach S5 and S7 from S4, unless restored as described herein.

Therefore, directed search tool 2 finds and exercises difficult-to-reach behaviors, because step 4 finds unvisted states from a "known good state" (i.e. a state that has already been simulated, e.g. current state S2). Such use of a known good state complements existing verification methodologies, because circuit designers find and fix functional errors found in response to typical stimuli that are provided in the test vectors (e.g. in file 1 in FIG. 1A).

When all state transitions have not been exercised in step 17, directed search tool 2 saves (see step 18) one of the next states as the current state, and thereafter returns to step 4 (i.e. to substep 14A) (described above). The remaining next states are saved and used as current state in future applications of step 14B. In this manner, directed search tool 2 attempts to exercise all state transitions, while using the measure of verification to minimize repetition of simulations that have already been performed. Directed search tool 2 also minimizes the repetition of previously performed simulations by simply automatically restoring the simulation to a non-reset state (as illustrated in step 4). In the above-described example of controller 20, use of the verification measure eliminates states S3 and S4 (FIG. 1C) from simulation after time T5 (FIG. 1D), while restoration to state S2 eliminates repetitive simulation of state S1 and any number of additional states that may exist between states S1 and S2. Such elimination of the repetitive simulation performed by the prior art methods (e.g. by resetting the simulation to reset state S1 for each simulation) provides significant advantages in the form of increased speed and efficacy in finding functional defects in the circuit-under-verification.

Figure 2A:
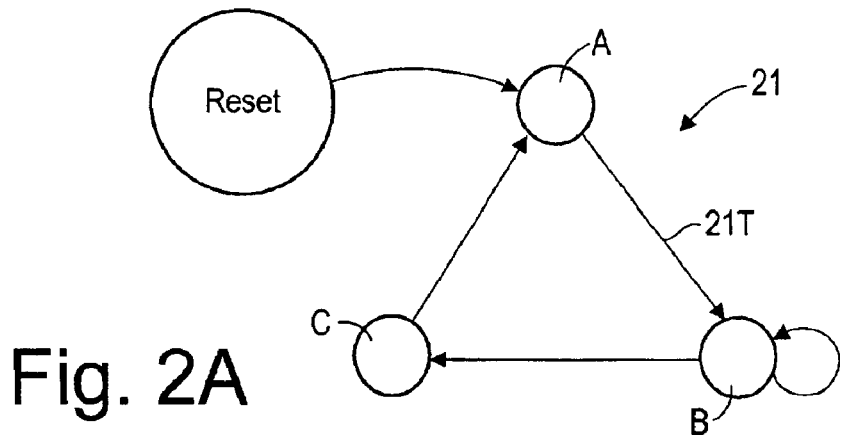
FIGS. 2A–2C illustrate, in state diagrams, examples of different controllers in a circuit under simulation.
Figure 2B:
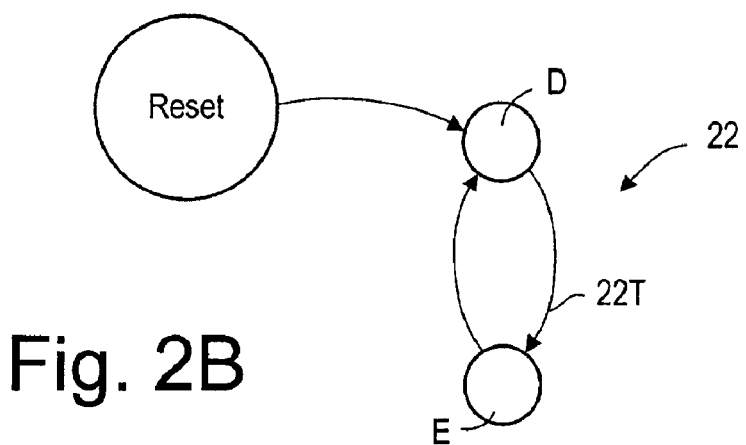

Although simulation of a single controller (e.g. controller 20) has been described above, a circuit-under-verification (e.g. as described in file 1A) can include a number of such controllers (e.g. controllers 21 and 22 illustrated in FIGS. 2A and 2B). In such a case, directed search tool 2 illustrated in FIG. 1B can be used multiple times to exercise each of such controllers individually. However, functional defects that are likely to result from unusual interactions between such controllers cause, for example, synchronization errors, resource conflicts, and "one-cycle-off" problems that may not be found by such simulation of individual controllers.

Figure 2C:
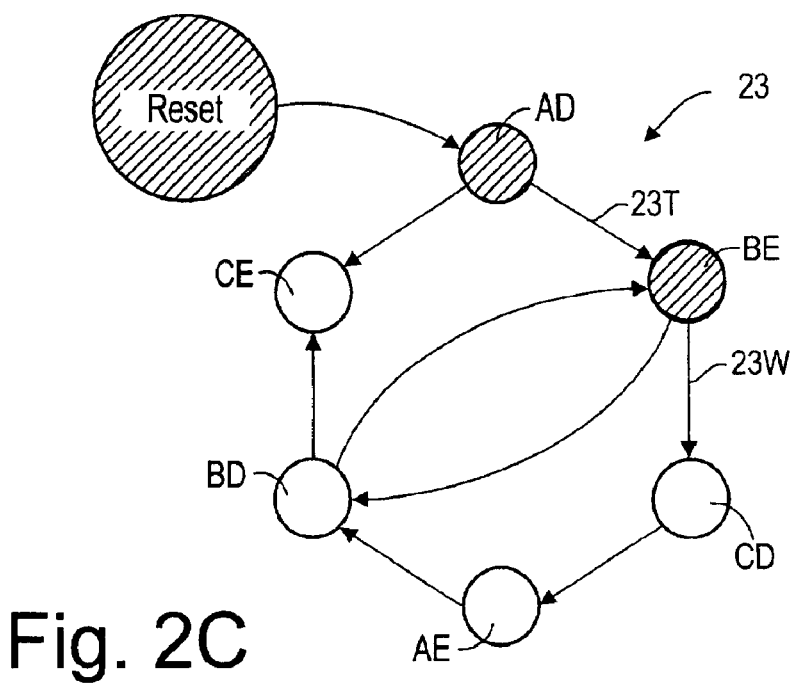
Figure 2D:
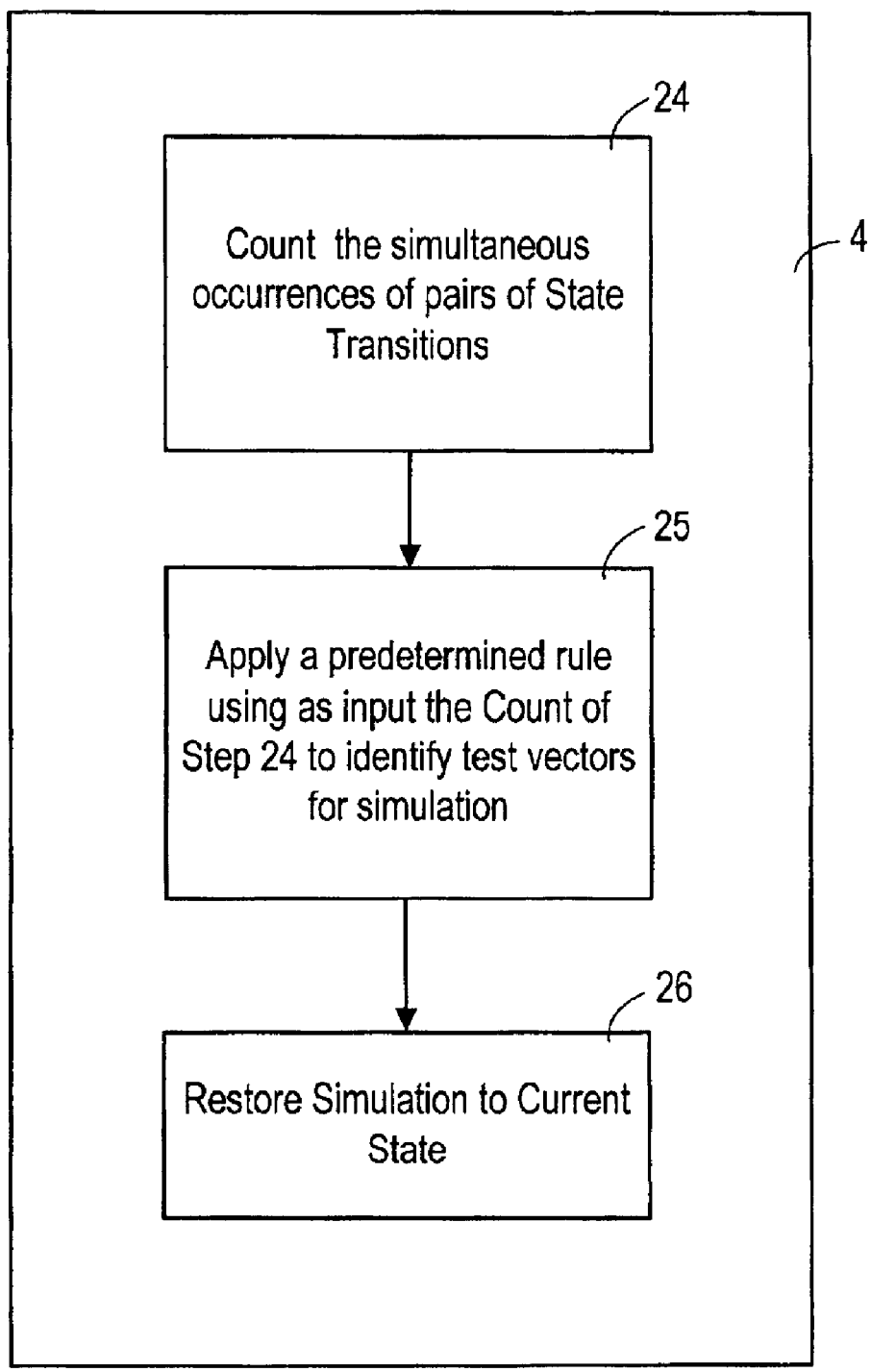
FIG. 2D illustrates, in a flow chart, substeps performed in another implementation of step 4 of FIG. 1A.

Therefore, in another embodiment, directed search tool 2 implements, in step 4, substeps 24–26 (see FIG. 2D) that searches for such functional defects. Substep 24 counts the simultaneous occurrences of pairs of state transitions, wherein each pair consists of a state transition of each of the two controllers. In a circuit-under-verification having controllers 21 and 22, directed search tool 2 enumerates all possible next states of controllers 21 and 22, and the corresponding pairs of state transitions. In the above-described example, the current states of controllers 21 and 22 are respectively states A and D as illustrated by a paired state AD (see "paired" controller 23 in FIG. 2C) that is obtained by pairing states A and D of controllers 21 and 22. The next states of controllers 21 and 22 are B and E respectively that are reached by respective transitions 21T and 22T (FIGS. 2A and 2B), as illustrated by paired transition 23T (FIG. 2C).

Thereafter, in substep 25, directed search tool 2 applies a predetermined rule, using as input the count of step 24 to identify a test vector for simulation. In the above-described paired controller 23 (FIG. 2C), if states AD, BE and BD have already been simulated (as illustrated by hatching in FIG. 2C), directed search tool 2 identifies (in step 25) a test vector for transitioning to state CD in response to the test vector 23W. Next, directed search tool 2 automatically restores the simulation to the current state BE. Step 25 is illustrated by the function "zi_dpli_poke" in module sd, at lines 2840 to 3156 of microfiche Appendix 41.

Figure 2E:
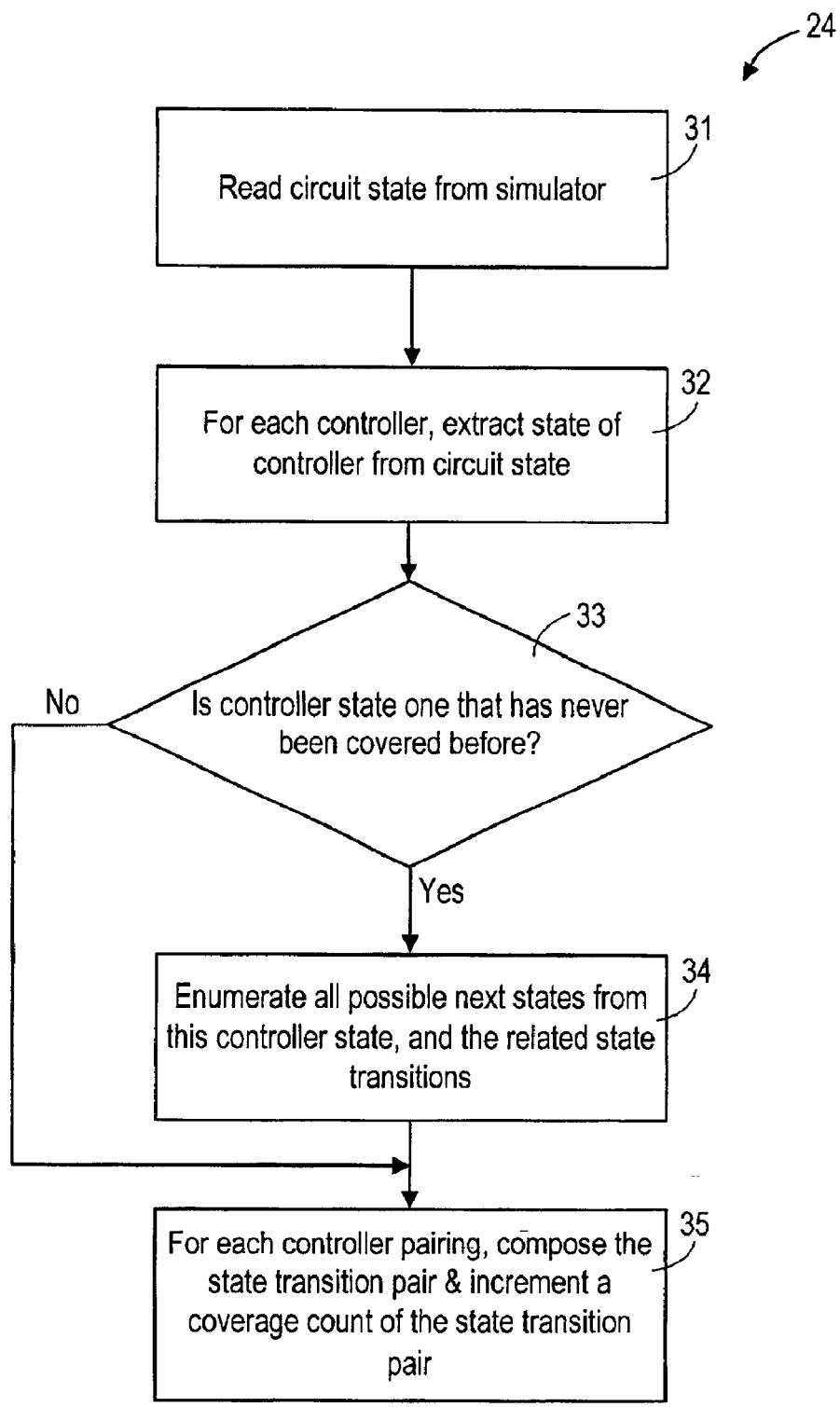
FIG. 2E illustrates, in a flow chart, actions performed during implementation of substep 24 in FIG. 2D.

In one particular implementation, directed search tool 2 implements substep 24 by performing actions 31–35 (FIG. 2E). Specifically, directed search tool 2 reads the current state of the circuit-under-verification from the simulator (as illustrated by action 31). Action 31 is illustrated by the function "zi_dpli_peek" in module sd, at lines 3272 to 3327 of microfiche Appendix 41. In this particular action, the signal in each storage element (e.g. registers 61–65 in FIG. 2H) of the circuit is read, and all the signals together form the state of the circuit. Next, directed search tool 2 extracts from the current state of the circuit-under-verification, the state of each controller (as illustrated by action 32). Action 32 is illustrated by the function "zi_fsmdb_extract_state" in module fsmdb, at lines 3327 to 3351 of microfiche Appendix 23. Thereafter, if any controller state is found to be simulated for the first time, directed search tool 2 enumerates all possible states that can be reached from that newly simulated state, and also enumerates all related state transitions (as illustrated in action 34). Action 34 is illustrated by the function "zi_ienum_arcs" in module satsetup, at lines 2087 to 2137 of microfiche Appendix 40.

Next, directed search tool 2 composes a state transition pair for the most recently performed simulation step, and increments a count of the state transition pair (as illustrated in action 35). Action 35 is illustrated by the function "zi_fsmdb_srchgrp_update" in module fsmdb, at lines 5122 to 5208 of microfiche Appendix 23. If the controller state extracted in action 32 was previously simulated, directed search tool 2 skips performing action 34 and directly performs action 35 (described above).

Figure 2F:
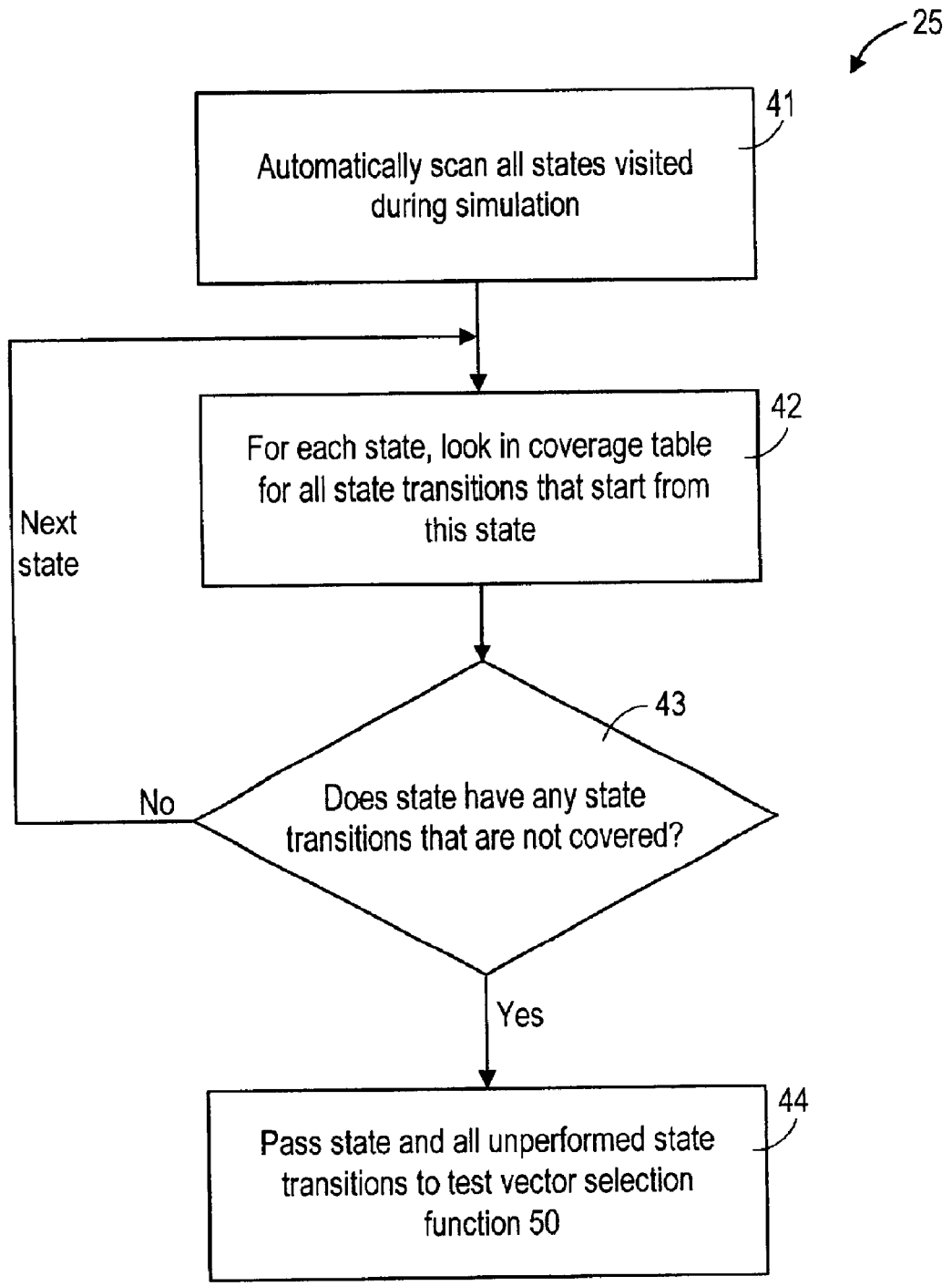
FIG. 2F illustrates, in a flow chart, actions performed in substep 25 in FIG. 2D.

In the above-described pair controller 23, when state BE is first simulated, the previous state being state AD, the state of the circuit is retrieved from the simulator by step 31. Thereafter, step 32 extracts the state of each of the user defined controllers (e.g. in file 1C), finding controller 21 to be in state B and controller 22 to be in state E respectively. Since this is the first time that the states B and E respectively have been simulated, therefore step 34 is applied to both controllers. Hence, controller 21 is enumerated to find all the next states from state B, namely B and C, and controller 22 is enumerated to find all the next states from state E, namely D. Step 34 is performed in preparation for step 42 (FIG. 2F). Thereafter, step 35 composes the transition pair that was covered, in this example, from state AD to state BE, and increments a count indicating the number of times the transition AD to BE has been covered in simulation.

Figure 2G:
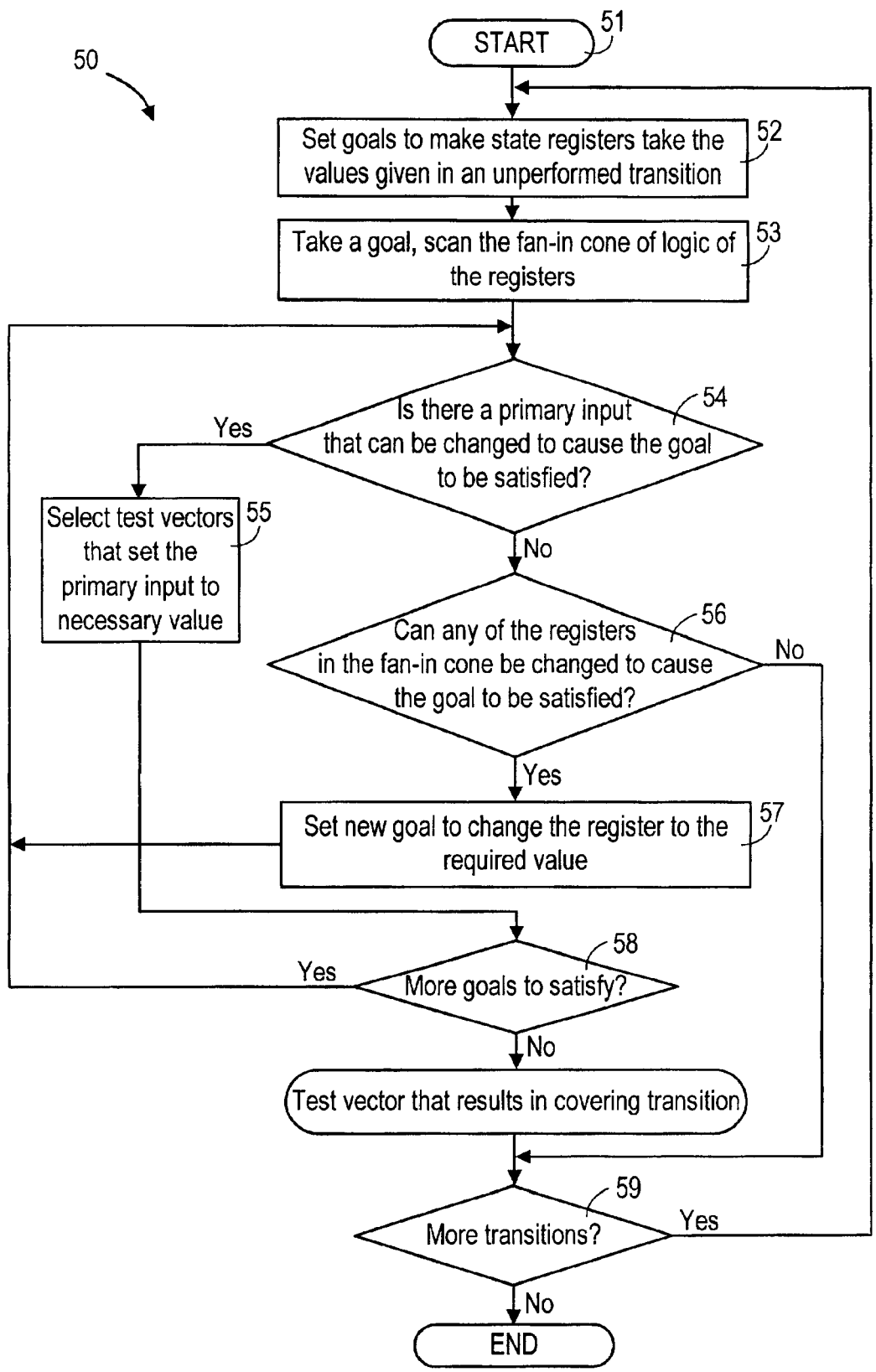
FIG. 2G illustrates, in a flow chart, substeps performed by a test vector selection function invoked in action 44 of FIG. 2F.

During the implementation of substep 25 (FIG. 2D), directed search tool 2 performs actions 41–45 (FIG. 2F). Specifically, directed search tool 2 automatically scans (in action 41) all states that have been simulated. Action 41 is illustrated by the function "zi_score_state" in module srch_ctrl, at lines 1081 to 1744 of microfiche Appendix 45. Thereafter, directed search tool 2 examines the verification measures (as discussed above in reference to substep 24) for all state transitions that start from the current state. Next, directed search tool 2 checks whether any of the state transitions has not yet been performed during the simulation (as illustrated by action 43). If so, directed search tool 2 presents the current state and all state transitions that have not been performed to a function 50 (FIG. 2G) for identification of test vectors. Action 43 uses functions "zi_fsmdb_srchgrp_lookup" in module fsmdb, at lines 5450 to 5544 of microfiche Appendix 23, and function "zi_fsmdb_ifsm_lookup_state" in module fsmdb, at lines 3363 to 3399 of microfiche Appendix 23. Action 43 is illustrated by function "zi_candidate_new_arc" in module srch_ctrl, at lines 1800 to 1860 of microfiche Appendix 45.

Figure 2H:
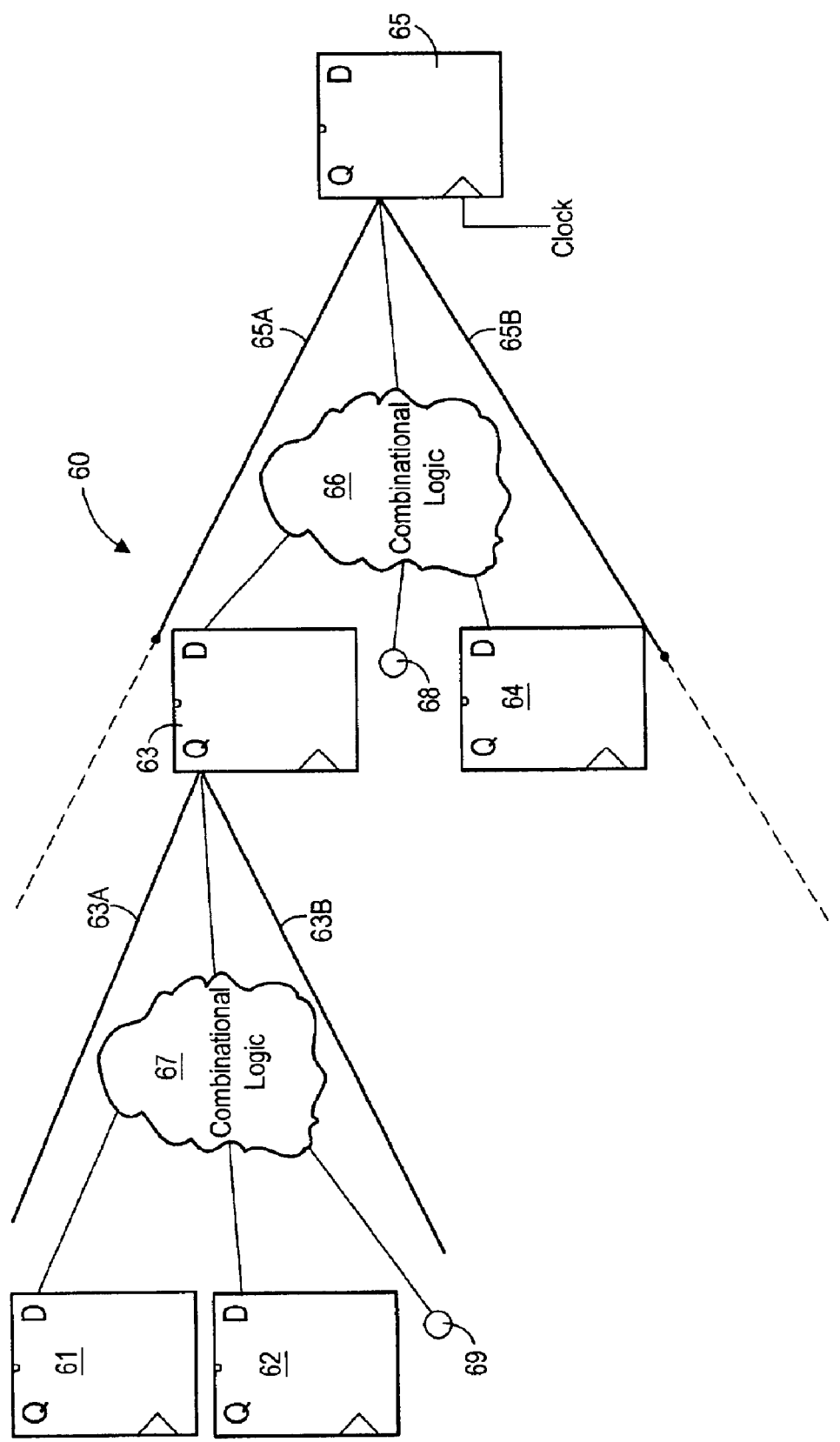
FIG. 2H illustrates, in a circuit diagram, use of the test vector selector function to find a test vector.

Function 50 performs steps 51–59 to identify test vectors that exercise one or more of the not-yet-performed state transitions. Specifically, in step 51, function 50 starts executing, and performs any necessary initialization. An example of the initialization task is illustrated by the function "zi_sat_setup" in module satsetup, at lines 3713 to 3778 of microfiche Appendix 40. Thereafter, in step 52, function 50 sets goals to make registers (hereinafter "state registers") of the circuit-under-verification take values which will result in performance of a not-yet-performed state transition. Step 52 is illustrated by the function "zi_sat_set_goals" in module sat, at lines 1915 to 1972 of microfiche Appendix 39. Next, in step 53, function 50 takes a goal, and traverses the circuit backwards from an input terminal (e.g., for example from the "Q" terminal of a flip-flop 65 in a circuit 60 (FIG. 2H). Step 53 is illustrated by the function "zi_sat_backtrace" in module sat, at lines 1590 to 1625 of microfiche Appendix 39.

In circuit 60, all circuit elements reached by the backward traversal are illustrated in FIG. 2H within a space called "cone of logic". The cone of logic is delimited by lines 65A and 65B that intersect at the "Q" terminal of flip-flop 65, and fan out backward to include storage elements, e.g. registers 61–64, groups of logic elements 66 and 67, and input terminals 68 and 69. The cone of logic is transitive, i.e. the cone of logic of flip-flop 65 includes the fan-in of flip-flop 63 because flip-flop 63 fans-out to the "Q" terminal of flip-flop 65. Each level of flip-flops in the cone of logic is considered to be one cycle of logic. The cone of logic extends backwards for some number of cycles of logic and is terminated by a maximum cycle number that is set by a budget measure, either by the user or automatically. The cone of logic is established by step 51 for each of the state registers for which a goal exists. Thereafter, all register values outside the cone of logic are considered constants. Registers inside the cone of logic are also considered constants if there are no input terminals that can change values to affect the value of the register.

Thereafter, in step 54, function 50 checks if a change in a signal at an input terminal (e.g. one of terminals 68 and 69) is sufficient to satisfy the goal. If so, function 50 selects test vectors necessary to set the input terminal to the required signal value (as illustrated in step 55), and goes to step 58 to check if more goals need to be satisfied.

In step 54, if the goal cannot be satisfied, function 50 checks if a signal in any one of the registers 61–64 in the cone of logic can be changed to satisfy the goal (e.g. if the values are symbols of the type used in symbolic simulation). If none of the values in registers 61–64 can be changed (e.g. because the values are constants), function 50 goes to step 59 to check if any more state transitions remain not-yet-performed (as illustrated by step 59). If so, function 50 returns to step 52 (described above).

Alternatively, if in step 52 if a register does not have a constant value, function 50 sets the goal to change the register to the necessary value required to satisfy the current goal (as illustrated in step 57) and thereafter returns to step 54 if more goals remain to be satisfied. The steps 54–57 are illustrated by the function "zi_sat_satisfy" in module sat, at lines 1985 to 2064 of microfiche Appendix 39.

In one embodiment, function 50 is assisted by performing a symbolic simulation of the circuit in parallel with the normal circuit simulation in steps 3 and 5 of FIG. 1A. A symbolic simulator is illustrated by the function "zi_syms_run" in module ss, at lines 2416 to 2536 of microfiche Appendix 46.

Thereafter, during backward traversal through the cone of logic, when function 50 reaches a storage element containing a symbol, function 50 simply picks an appropriate value in the range represented by the symbol that satisfies the goal. Therefore, symbolic simulation eliminates the need to traverse backward all the way to the input terminal that originated the range of values at the storage element.

Although the controllers mentioned heretofore refer to controllers in the circuit, additional controller descriptions, called "protocol controllers", can be used to represent the allowable test vectors that can be applied to the input terminals of the circuit. In such a case, the verification measure in the above description can be a count of the simultaneous performance of a state transition of a controller of the circuit and a state transition of a protocol controller.

Therefore, in another embodiment, directed search tool 2 implements in step 32 (FIG. 2E), extraction of the both the state of a controller of the circuit and the state of a protocol controller. In one implementation, a description of a protocol controller is combined with the circuit description and used as input for directed search. In this case, step 32 extracts the protocol controller state in the same manner as it extracts the circuit state.

Figure 3A:
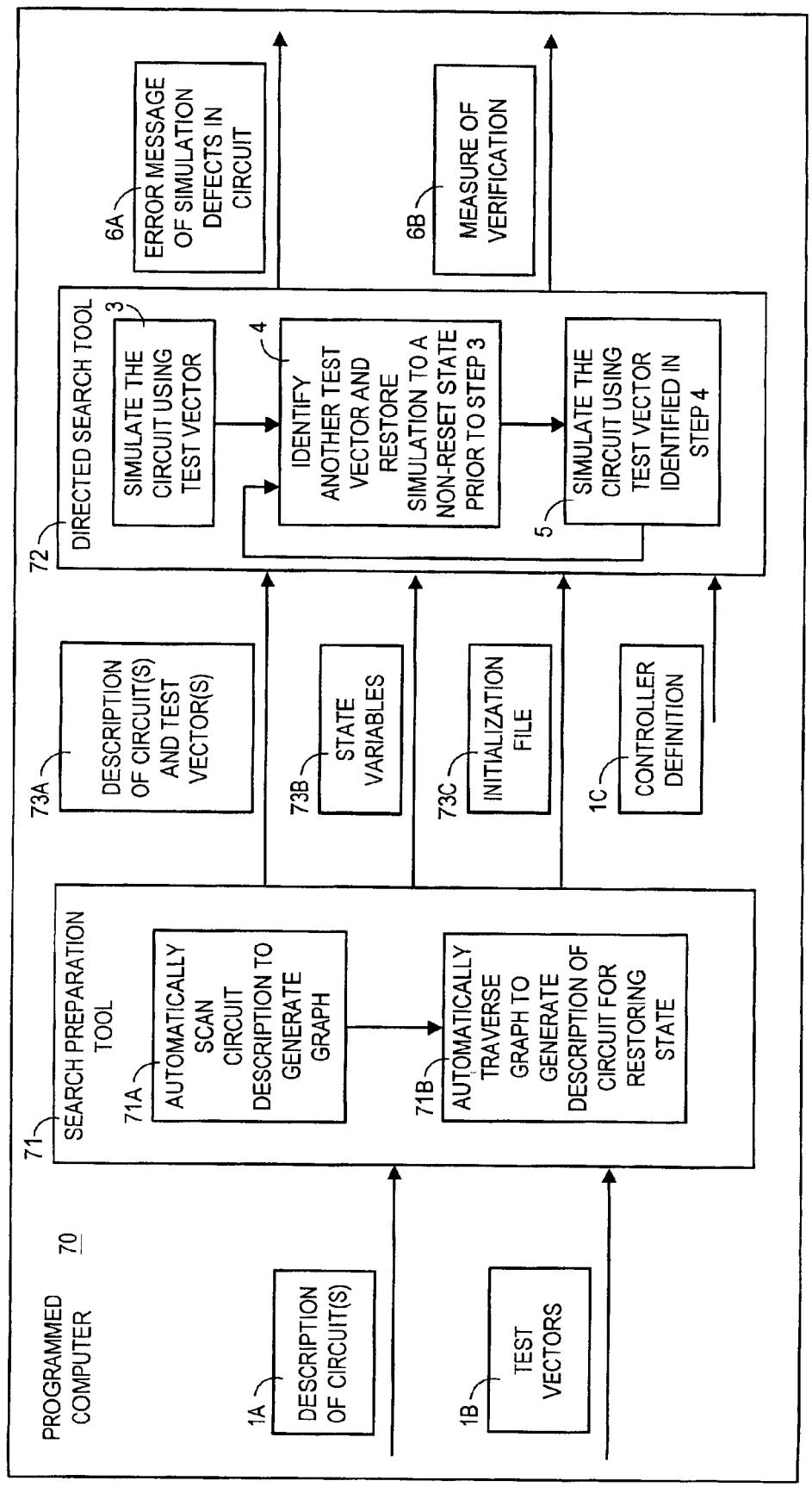
FIG. 3A illustrates, in a data flow diagram, use of a search preparation tool to refine a description of the circuit-under verification.
Figure 3B:
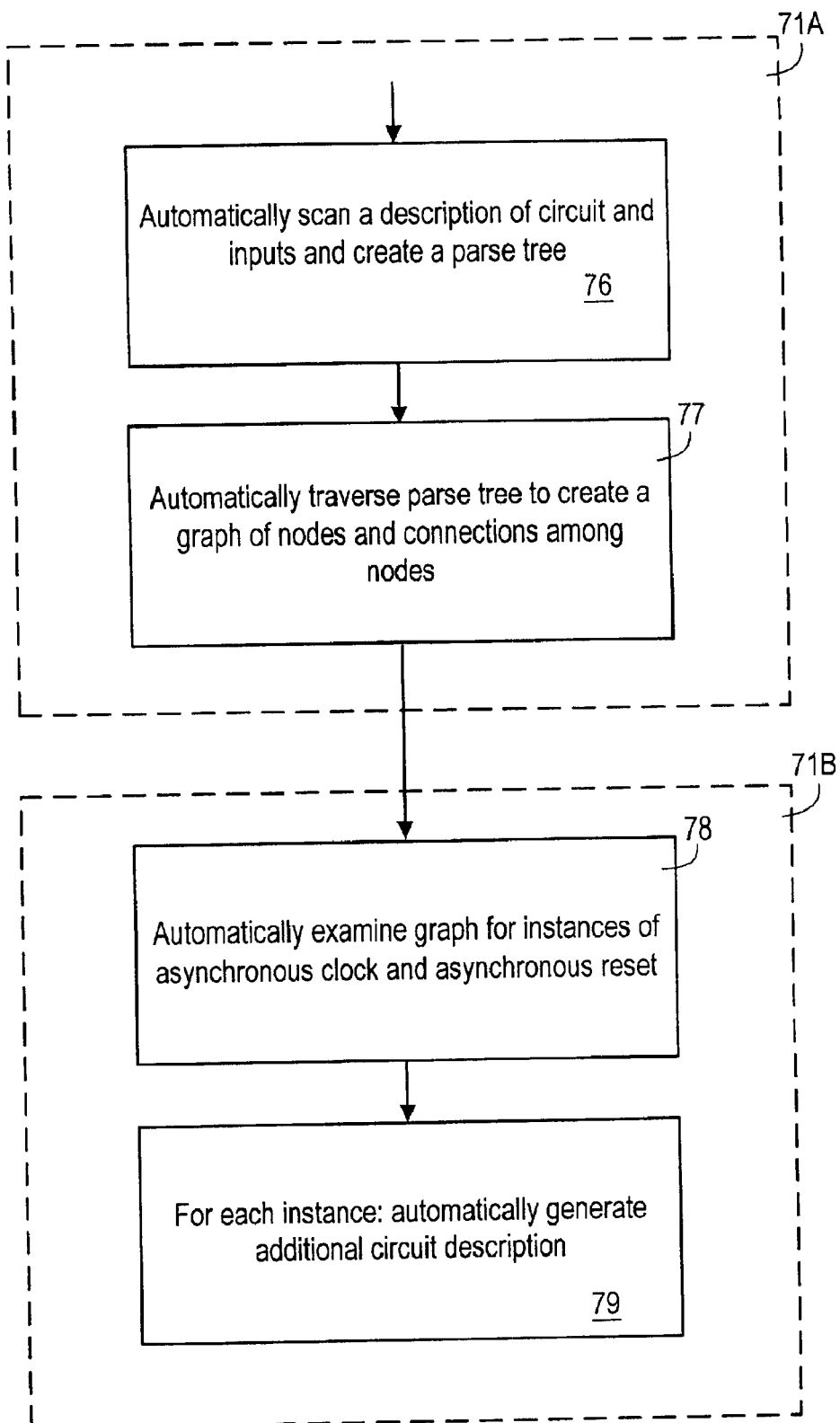
FIG. 3B illustrates, in a flow chart, the steps performed by the search preparation tool of FIG. 3A.
Figure 3C:
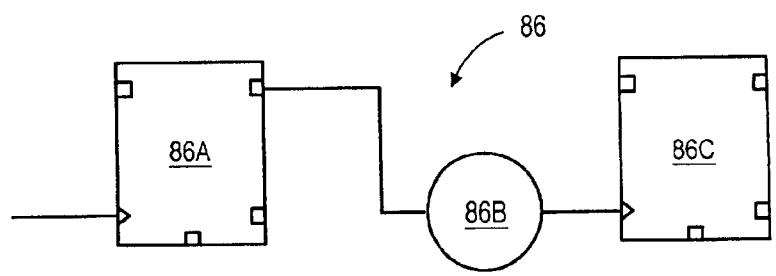
FIG. 3C illustrates, in a graph, an arrangement (of two storage nodes and a logic node and connections) that can cause asynchronous behavior in a circuit-under-verification by clocking a storage element with an asynchronous signal.

In another embodiment, a computer 70 is programmed with a search preparation tool 71 that automatically scans (as illustrated by step 71A) descriptions of circuitry (e.g. in file 1A) to generate a graph, and thereafter automatically traverses (see step 71B) the graph to generate a description that is refined, e.g. by eliminating unnecessary circuitry, such as a declared register that is the destination of an assignment statement in a verilog "always" statement. Specifically, in step 71A (FIG. 3B), search preparation tool 71 automatically creates a parse tree (see substep 76) and thereafter traverses (see substep 77) the parse tree to create the graph. Substeps 76 and 77 are similar or identical to substeps 210 and 220 described in reference to FIG. 2 in the U.S. patent application Ser. No. 08/955,329 incorporated by reference above. Therefore, search preparation tool 71 generates a description (e.g. in file 73A in FIG. 3A) that describes circuit elements remaining in the graph resulting from flattening and load refinement (described in reference to actions 408 and 409 in FIG. 4A in the U.S. patent application Ser. No. 08/955,329 incorporated by reference above). One implementation of this embodiment is illustrated in function "zi_n1_create_graph" in module n1, at lines 1691 to 1771 of microfiche Appendix 33 and in function "zi_elab_design" in module elab, at lines 4633 to 4702 of microfiche Appendix 18.

In this particular embodiment, search preparation tool 71 also describes (e.g. in file 73A) one or more circuits (also called "restoration circuits") that may be required (depending on the circuit-under-verification) for restoring signals (also called 11 "asynchronous signals") that occur in the clock cycle immediately following the current state, and that may not occur after restoration of simulation to the current state. During simulation, directed search tool 72 saves the state at each clock cycle, and uses the restoration circuits and the state (hereinafter "previous state") that immediately precedes the current state to recreate such asynchronous signals after state restoration. One implementation of such a directed search tool 72 is illustrated by function "zi srch_ctrl" in module srch_ctrl, at lines 2024 to 2616 in microfiche Appendix 45.

Figure 3D:
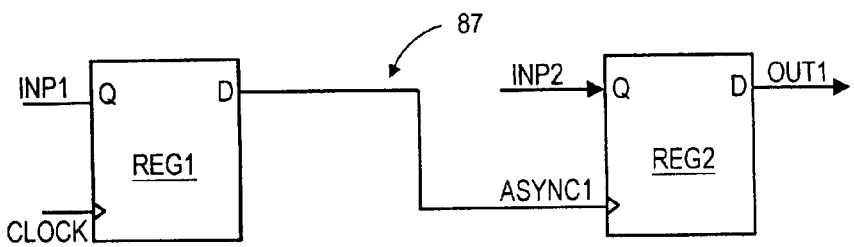
FIG. 3D illustrates, in a graph form, a circuit-under-verification having nodes in the arrangement of FIG. 3C.

Therefore, in step 71B (FIG. 3B), search preparation tool 71 automatically examines the graph for instances of an arrangement that can result in an asynchronous signal being used to clock a storage element, or to reset a storage element. For example, search preparation tool 71 automatically traverses the graph to find all instances of an arrangement 86 that includes two storage nodes 86A and 86C, wherein an output terminal D of a first storage node 86A is coupled to a clock terminal C of second node 86C, e.g. through a logic node 86B. In one example, search preparation tool 71 scans the following description of circuit 87 (FIG. 3D) in Verilog provided in file 1A (FIG. 3A):

```
module asynch_example (clk, Q_p, Q_pp, D_pp);
input clk;
input Q_p;
input Q_pp;
output      D_pp;
reg    reg1;
reg    reg2;
assign      D_pp = reg2;
always      @(posedge clk) begin
    reg1 <= Q_p;
end
always      @(posedge reg1) begin
    reg2 <= Q_pp;
end
endmodule;
```

Figure 3E:
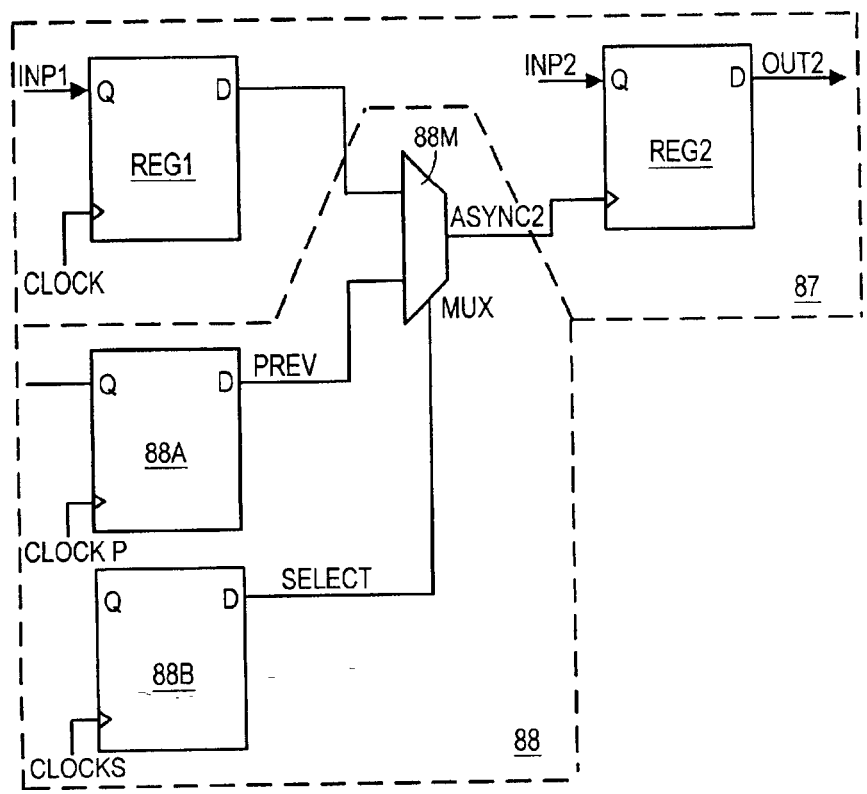
FIG. 3E illustrates, in a graph form, a circuit generated by performing the steps of FIG. 3B.
Figure 3F:
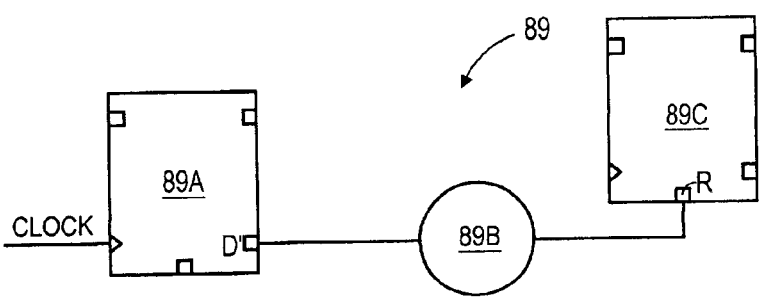
FIG. 3F illustrates, in a graph, an arrangement (of two storage nodes and a logic node and connections) that can cause asynchronous behavior in a circuit-under-verification by resetting a storage element with an asynchronous signal.
Figure 3H:
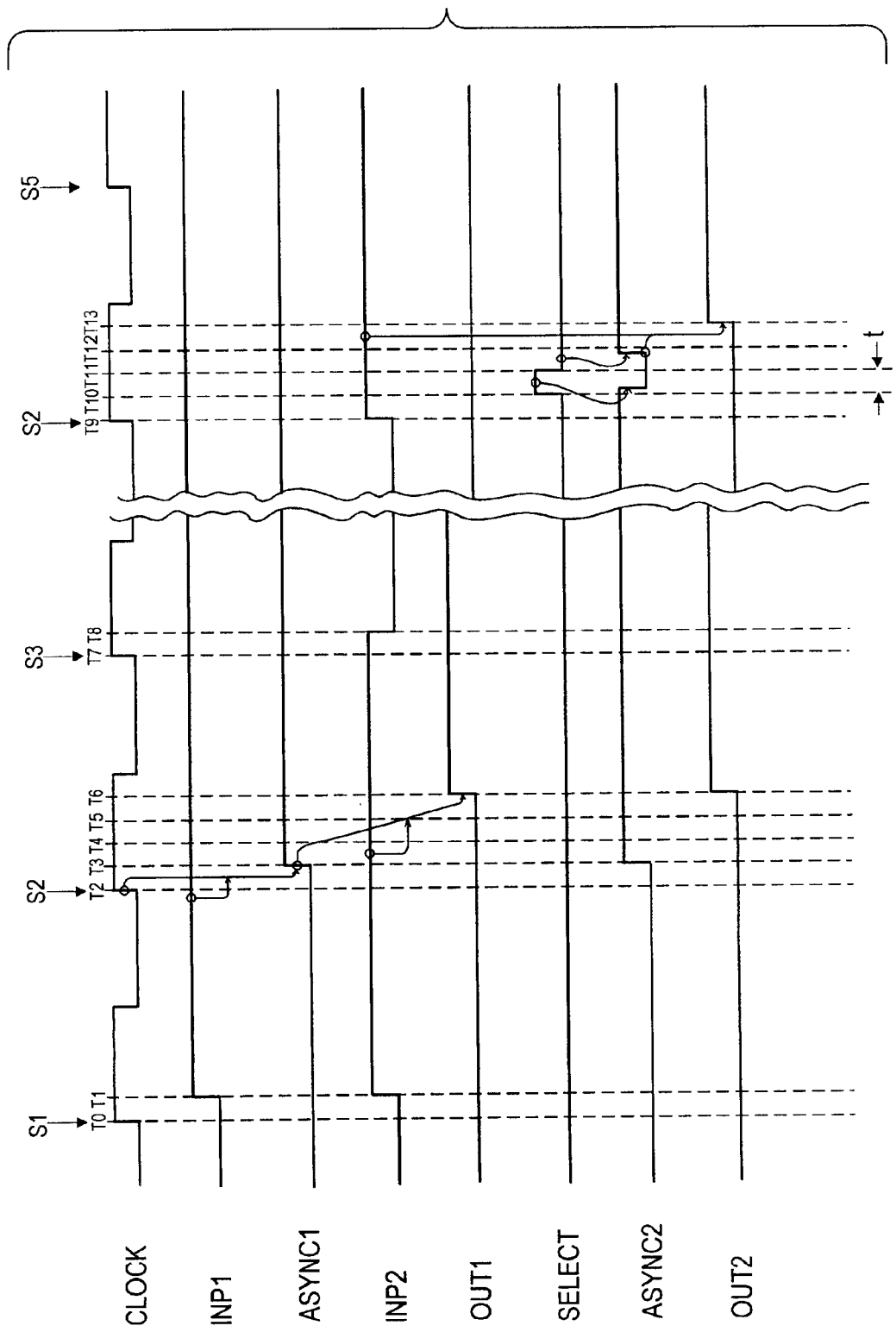
FIG. 3H illustrates, in a timing diagram, the temporal relationship between the substeps of FIG. 3G.

Circuit 87 (FIG. 3D) is in state S1 (FIG. 1C) at a rising edge in a clock signal CLOCK (e.g. at time T0 in FIG. 3H), and signal INP1 goes active at the Q terminal of storage element REG1 (FIG. 3D) a short time thereafter (e.g. at time T1). Therefore, storage element REG1 drives a signal ASYNC1 active a short time after the next rising edge (e.g. at time T2) in clock signal CLOCK (e.g. at time T3). The rising edge in signal ASYNC1 causes storage element REG2 to take the value of INP2 at time T6. Thereafter, when circuit 87 is restored to state S2 (e.g. at time T9), the signal ASYNC1 does not have a rising edge. Specifically, in the state prior to time T9, ASYNC1 is active and INP2 is inactive. At time T9, state S2 is restored to the simulator, for example using a C language interface to the simulator as illustrated by calls to the function "acc_set_value" in module sd, at lines 3264, 3607 and 3729 in microfiche Appendix 41. The step of restoring causes the values of all signals to take their respective values at time T6 when state S2 was first simulated. Consequently, INP2 becomes active and ASYNC1 remains active which causes REG2 to fail to clock a new value when simulated to state S5 in FIG. 1C because it does not observe a rising edge on ASYNC1.

Specifically, the rising edge in signal ASYNC1 causes storage element REG2 to supply during the transition from state S2 to state S3 (e.g. at time T6 in FIG. 3H) a signal INP2 received at the Q terminal as the output signal OUT1 at the D terminal. However, in the absence of the rising edge in signal ASYNC1 after restoration, storage element REG2 fails to supply (e.g. during the transition from state S2 to state S5) signal INP2 as output signal OUT1. Therefore, in this example, signal OUT1 is low prior to the restoration step at time T9 and remains low at time T13 during simulation after restoration. The reference numerals T9–T16 (FIG. 3H) identify the simulation time after restoring state S2 and correspond to the reference numerals T2–T6 of simulation time after state S2 without restoration.

To recreate an asynchronous signal (e.g. signal ASYNC1), search preparation tool 71 generates a description of a restoration circuit that includes a multiplexer (e.g. multiplexer 88M) that has two input terminals, a control terminal and an output terminal, wherein the output terminal is coupled to the second storage element (e.g. storage element REG2) and a first input terminal is coupled to the first storage element REG1. Each restoration circuit also includes (1) a first storage element (also called "previous' value register", e.g. element 88A) coupled to the second input terminal of multiplexer and (2) a second storage element (also called "asynchronous MUX select register", e.g. element 88B) coupled to the control terminal of multiplexer.

In the above-described example, during step 71B (FIG. 3A), search preparation tool 71 finds that a storage element REG2 in circuit 87 has a clock terminal that is coupled to storage element REG1 in the above-described arrangement 86 (wherein there is no logic node in circuit 87), as illustrated in function "zi_hout_mark_gcm_asynch_reset" in module hout, at lines 9016 to 9094 in microfiche Appendix 28. On finding such an instance of arrangement 86 in circuit 87, search preparation tool 71 generates the following instructions in Verilog for a restoration circuit 88 (FIG. 3E) that assists in restoration of asynchronous signals in the circuit-under-verification (by directed search tool 72 in step 4; see FIG. 3A).

```
module asynch_example (clk, Q_p, Q_pp, D_pp);
input clk;
input Q_p;
input Q_pp;
output      D_pp;
reg    reg1;
reg    reg2;
reg    prev_reg1;    // Extra registers and wire
reg    asynch_mux_select;
wire   asynch_clk;
assign asynch_clk =
       asynch_mux_select ? reg1 : prev_reg1;
       // Extra MUX
assign D_pp = reg2;
always      @(posedge clk) begin
    reg1    <= Q_p;
end
always @(posedge asynch_clk) begin
// Clock from new wire from MUX
    reg2    <= Q_pp;
end
endmodule;
```

Thereafter, during the restoration of a state, e.g. state S2 (FIG. 1C), directed search tool 72 performs substeps 81–85 (FIG. 3G) in step 4 (FIG. 3A) using restoration circuits (e.g. circuit 88) generated by search preparation tool 71 to generate at least a majority of the asynchronous signals (all asynchronous signals in one example). Specifically, in substep 81, directed search tool 72 forces the values of a majority of the storage elements (in one example all the storage elements) in the circuit to the values that were held in the current state (e.g. in state S2). Next, in substep 82, directed search tool 72 forces each previous value register to hold the value at the first storage node in the arrangement (e.g. the value at storage node 86A) in the previous state. Specifically, in circuit 87 (FIG. 3E), directed search tool 72 causes previous value register 88A to hold the value in storage element REG1 in state S1, e.g. the value 0. Thereafter, in substep 83, directed search tool 72 forces each asynchronous MUX select register to the value that causes the multiplexer to pass to the clock terminal of the second storage element the signal from the previous value register. Therefore, in the above-described example, directed search tool 72 drives the signal CLOCKS active that in turn causes storage element 88B to drive signal SELECT active (as illustrated at time T10 in FIG. 3H).

Next, in step 84, directed search tool 72 forces the simulation to proceed for a non-zero time period, specifically the simulation time needed for the signal PREV from storage element 88 to go through multiplexer 88M and reach the clock terminal of storage element REG2. The time period can be, for example, one nanosecond of simulation time, even if the delay through multiplexer 88M is zero. Therefore, at time T11 the signal ASYNC2 at the clock terminal of storage element REG2 goes low as illustrated at time T11 in FIG. 3H. Thereafter, directed search tool 72 forces each asynchronous mux select register to the value that causes the multiplexer to pass the signal at the first storage node 86A (FIG. 3A) in state S2. In the above-described example, directed search tool 72 causes storage element 88B to drive the signal SELECT inactive that in turn causes multiplexer 88M to pass the signal of value 1 from storage element REG1 to the clock terminal of storage element REG2. Hence, signal ASYNC2 goes high at the clock terminal of storage element REG2 at time T12. Therefore, storage element REG2 receives, at the clock terminal, a rising edge in the signal at time T12 that in turn causes storage element REG2 to supply as signal OUT2 the signal INP2.

Figure 4:
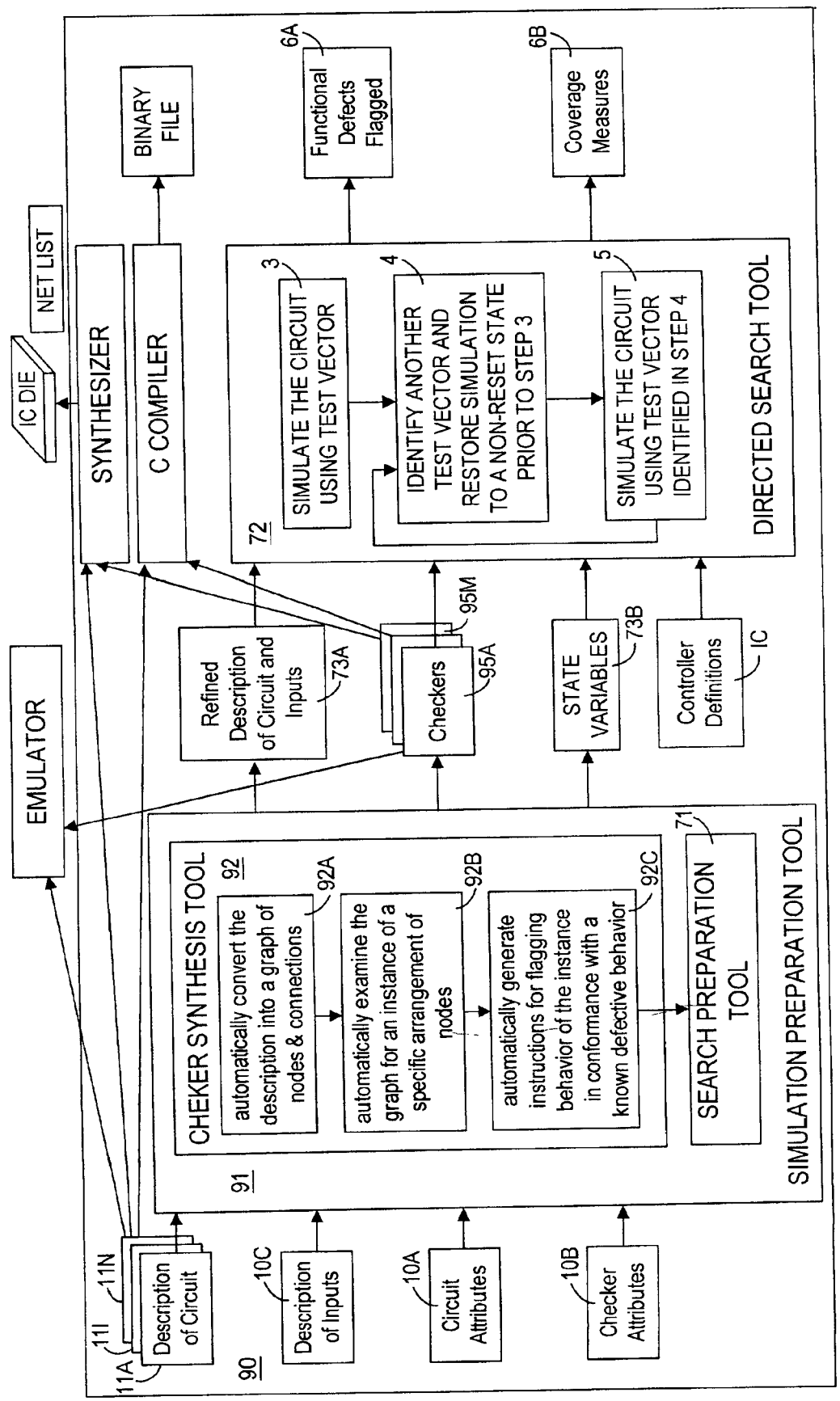
FIG. 4 illustrates, in a data flow diagram, use of a checker synthesis tool in a preparation tool for automatically generating checkers used during simulation by a directed search tool.

In another embodiment, the directed search tool 2 can be combined with automatically generated checkers as illustrated in FIG. 4. The automatically generated checkers are created by simulation preparation tool 91 from the circuit description by automatic conversion (see step 92A), automatic examination (see step 92B) and automatic generation (see step 92C), as described in the above-referenced U.S. patent application Ser. No. 08/955,329. Thereafter, the checkers (e.g. in files 95A–95M) are simulated with simulation of the circuit (as described in file 73A) by directed search tool 72. During the directed search, the checkers flag known defective behavior.

Appendices 1–58 in the microfiche attached hereto contain software listings and documentation as follows:

| Appendix Number | Appendix Name | Description |
|---|---|---|
| 1 | arr | Data structures and utilities to implement arrays, used by many other modules, e.g. fsmdb |
| 2 | assertion | Handlers for assertions, used by many other modules, e.g. srch_ctrl |
| 3 | attr | Data structures and utilities for recording attributes in the database, used by dbo |
| 4 | avl | Data structures and utilities to implement a balanced tree, used by srch_ctrl |
| 5 | bdo | Calculates the binding distance offset of symbols, used by ss and sat |
| 6 | bm | Data structures and utilities to implement symbol bindings, used by sat |
| 7 | bv | Data structures and utilities to implement bit vectors, used by stmgr |
| 8 | chx | Creates checker models, called by dsh |
| 9 | cm | Creates and analyzes paths carrying data in the netlist, used by chx |
| 10 | conset | Data structures and utilities to implement constraints for symbols, used by sat |
| 11 | const | Data structures and utilities for Verilog constants, used by pt |
| 12 | cpli | Data structures and utilities for C-language interface to Verilog, called from simulator when running checkers |
| 13 | dbo | Maintains database of netlist, protocols and state machine attributes, used by dsh and sd |
| 14 | dcf | Data structures and utilities for search parameter file, used by sd |
| 15 | debug | Utilities to debug checker synthesis and search tools, used by many modules, e.g. srch_ctrl |
| 16 | dsesym | Data structures and utilities to implement a symbol table for search, used by stmgr and sd |
| 17 | dsh | Command shell for a user to interface to search preparation tool |
| 18 | elab | Converts the parse tree into netlist, called from dsh |
| 19 | er | Data structures and utilities to implement Verilog value change dump, used by seedex and sd |
| 20 | eval | Data structures and utilities for evaluating expressions, used by pm |
| 21 | expr | Data structures and utilities for creating expressions, used by pt and nl |
| 22 | fda | Data structures and utilities to implement optimized arrays, used by sat |
| 23 | fsmdb | Data structures and utilities to implement search pair arc coverage database, used by srch_ctrl |
| 24 | futil | Utilities to manipulate files, used by hout |
| 25 | gcm | Extract and write out Verilog model for search tool, called from dsh |
| 26 | gstack | Data structures and utilities to implement growable stack, used by sat |
| 27 | hash | Data structures and utilities to implement hash tables, used by many modules, e.g. fsmdb |
| 28 | hout | Writes out checker modules in Verilog using support routines, called from dsh |
| 29 | hsh | Command shell for a user to interface to the checker synthesis tool |
| 30 | list | Data structures and utilities to implement linked lists, used by many modules, e.g. srch_ctrl |
| 31 | mem | Utilities to manage memory allocation, used by many modules, e.g. srch_ctrl |
| 32 | mesg | Utilities to print messages, used by many modules, e.g. srch_ctrl |
| 33 | nl | Analyzes the netlist, called from dsh |
| 34 | osd | Utilities to print messages, used by sd |
| 35 | osd_nonpli | Utilities to print messages, used by sd |
| 36 | pm | Data structures and utilities for protocol analysis and interpretation, used by srch_ctrl and seedex |
| 37 | pt | Data structures and utilities for building a parse tree, used by nl and pm |
| 38 | random | Utilities for generating pseudo-random numbers, used by srch_ctrl |
| 39 | sat | Data structures and utilities for search satisfiability analysis, used by satsetup |
| 40 | satsetup | Data structures and utilities to prepare for search satisfiability analysis, used by srch_ctrl |
| 41 | sd | Utilities to interface search tool to C-language interface of Verilog, called by the simulator to setup parameters, start the search tool and read & set the state of the circuit in simulation |
| 42 | seedex | Data structures and utilities for seed trace reading and interpretation used by srch_ctrl |
| 43 | slice | Data structures and utilities to implement bit-slices, used by chx |
| 44 | snl | Data structures and utilities to implement netlist used for search, |

-continued

| Appendix Number | Appendix Name | Description |
|---|---|---|
| | | called from dsh and used by satsetup and sat |
| 45 | srch_ctrl | Data structures and utilities to control search, used by sd |
| 46 | ss | Data structures and utilities for symbolic simulation, used by srch_ctrl |
| 47 | stack | Data structures and utilities to implement stacks, used by srch_ctrl |
| 48 | stmgr | Data structures and utilities to manage states in search, used by srch_ctrl, fsmdb and sat |
| 49 | symb | Symbol table for Verilog parser, used by pt |
| 50 | ubv | Utilities to implement faster bit vector operations, used by stmgr and seedex |
| 51 | ufsm | Unroll FSM logic for analysis, called by dsh |
| 52 | value | Data structures and utilities to implement 16-value constants, used by ss and sat |
| 53 | version | Utilities to track the version of the checker synthesis and search tools, used by dsh |
| 54 | vout | Support routines for writing Verilog, used by hout |
| 55 | vp | Scans Verilog text and creates a parse tree, called from dsh |
| 56 | vpgen | Scans Verilog text and creates a parse tree for Verilog search model, called from dsh |
| 57 | vtype | Data structures and utilities for Verilog operations and types, used by vp |
| 58 | zdf | Utilities to save and restore netlist and attributes to disk, used by dbo |

Numerous modifications and adaptations of the embodiments described herein will be apparent to a person of skill in the art of electronic design automation (EDA) in view of the disclosure (including the software and documentation in microfiche Appendices 1–58 attached hereto, and the U.S. patent application, Ser. No. 28/955,329 incorporated by reference above). Other embodiments of a method in accordance with the invention include one or more of the following steps: automatically restoring a current state of simulation by applying a test vector that causes the simulation to return to the current state after one or more simulation cycles without entering a reset state; retaining in computer memory and using (for example, in step 41 of FIG. 2F) a subset of the states simulated; enumerating all possible next states of a current state (for example, in step 18 of FIG. 1B); using instructions in the "C" programming language to simulate the functional behavior of the circuit; using a "C" programming language description of a protocol controller; using a predetermined rule to select test vectors which uses as input the state of a protocol controller; using a predetermined rule which selects test vectors randomly; using a predetermined rule for selecting test vectors which selects all test vectors applicable to the current state; using more than one predetermined rule to select test vectors; using user-specified checkers in combination with directed search tool 2; using end-to-end tests in combination with directed search tool 2; using a golden model in combination with directed search tool 2; using instructions describing checkers as part of a verification quality-assurance test suite or regression test suite for a circuit description; using checkers in conjunction with a pre-existing testbench to find functional defects in a description of a circuit; using instructions describing checkers for characterizing the performance of a description of a circuit; and using instructions describing checkers to provide a measure of the functional testing of a description of a circuit. Therefore, many such variations of the embodiments described herein are encompassed by the attached claims.

What is claimed is:

1. A method for determining defects in the functional behavior of a circuit, the functional behavior of the circuit including a plurality of states and a plurality of transitions between the states, the states including a current state, a plurality of next states reachable from the current state, and a reset state, the method comprising:

simulating the functional behavior of the circuit using a description of the circuit, wherein the simulating includes:
transitioning the simulation from the current state to a first next state;
transitioning the simulation from the current state to a second next state;
wherein transitioning from the current state to the second next state is performed automatically after transitioning from the current state to the first next state without entering the reset state; and determining defects in the functional behavior of the circuit using the simulating.

2. The method of claim 1, wherein the simulation is set to the current state after transitioning to the first next state.

3. The method of claim 1, wherein the first transitioning is performed in response to a first test vector, and the second state transition is performed in response to a second test vector.

4. The method of claim 1, wherein:
said determining of defects comprises automatically flagging, during the simulating, functional behavior of the circuit in violation of a rule associated with a predetermined pattern.

5. The method of claim 1, wherein:
said determining of defects comprises automatically flagging, during the simulating, functional behavior of the circuit in violation of a rule associated with a predetermined pattern.

6. A method, implemented in a computer, of simulating a circuit, the circuit having a reset state of simulation in response to a simulated reset signal, the method comprising:

simulating the functional behavior of said circuit in response to a first test vector, wherein prior to said act of simulating the simulation has a current state;
restoring the simulation after said simulating act to said current state, without causing the simulation to pass through said reset state;
determining at least one next state that can be reached from the current state; and
simulating the functional behavior of said circuit in response to a second test vector, after said act of automatically restoring;
wherein each of said acts of simulating, restoring, and determining is performed in said computer.

7. The method of claim 6 wherein said circuit includes at least a first controller capable of performing a plurality of first state transitions, and a second controller capable of performing a plurality of second state transitions, the method further comprising:

automatically determining, during each of said acts of simulating, for each pair of a first state transition and a second state transition performed simultaneously at least once, the number of times of said simultaneous performance, said number indicating a measure of the functional testing of said description.

8. The method of claim 6 further comprising:
automatically applying a predetermined rule to identify said second test vector to transition from the current state to the next state, wherein the next state can be a simulated or non-simulated state.

9. The method of claim 6 further comprising:
automatically enumerating said state transitions; and
automatically applying a predetermined rule to identify said second test vectors, wherein said act of automatically applying uses as input to said predetermined rule at least one of said state transitions.

10. The method of claim 6, wherein said circuit, includes at least a first controller capable of performing a plurality of first state transitions, and a second controller capable of performing a plurality of second state transitions, the method further comprising:
automatically determining, during each of said acts of simulating, for each pair of a first state transition and a second state transition performed simultaneously at least once, the number of times of said simultaneous performance; and
automatically applying a predetermined rule to identify said second test vector; wherein said act of automatically applying uses as input to said predetermined rule at least one number determined by said act of automatically determining the number of times of said simultaneous performance.

11. The method of claim 10 further comprising:
automatically selecting a plurality of states of the controller that have not been reached from the current state.

12. The method of claim 6, wherein said current state is generated by simulating said circuit in response to a predetermined test vector.

13. The method of claim 6 wherein said circuit includes at least one asynchronous clock signal, said asynchronous clock signal having a first clock state when the simulation is in said current state, the method further comprising setting the asynchronous clock signal to a second clock state, said second clock state being different from said first clock state; wherein said act of setting is performed prior to said act of automatically restoring, and after said act of simulating with said first test vector.

14. The method of claim 6, wherein the act of simulating after automatically restoring the functional behavior of said circuit in response to test vectors identified by automatically applying a predetermined rule is repeated until all test vectors have been used in the simulation.

15. The method of claim 6, further comprising:
automatically restoring the simulation to a state that is different from the current state; and
transitioning the simulation from the state different from the current state to the current state by using a sequence of test vectors identified by automatically applying a predetermined rule.

16. The method of claim 6, wherein simulating a plurality of next states that are reachable from the current state by using different test vectors.

17. A method, implemented in a computer, of simulating, the method comprising:
simulating the functional behavior of a circuit in response to a first test vector in a plurality of test vectors; wherein the simulation has a current state that is a non-reset state prior to said act of simulating;
flagging, during said act of simulating, the functional behavior of said circuit in violation of a rule associated with said predetermined pattern;
restoring the simulation to said current state, said act of automatically restoring being performed after said simulating act; and
simulating the functional behavior of said circuit in response to a second test vector, after said act of automatically restoring, to produce a circuit design description;
wherein each of said acts of simulating, flagging, and restoring is performed in said computer.

18. The method of claim 17 wherein said circuit includes a first controller capable of performing a plurality of first state transitions, and a second controller capable of performing a plurality of second state transitions, the method further comprising:
automatically determining, during each of said acts of simulating, for each pair of a first state transition and a second state transition performed simultaneously at least once, the number of times of said simultaneous performance, said number indicating a measure of the functional testing of said description.

19. A method, implemented in a computer, for measuring the functional testing of a description of a circuit, said circuit including a first controller capable of performing a plurality of first state transitions, and a second controller capable of performing a plurality of second state transitions, the method comprising:
testing the functional behavior of said circuit with a first controller performing a first state transition simultaneous with a second controller performing a second state transition; and
determining, during said act of testing, the number of times of said simultaneous performance, said number indicating a measure of the functional testing of said description of the circuit;
wherein the act of testing and the act of determining are performed in said computer.

20. A method, implemented in a computer, for measuring the functional testing of a description of a circuit, said circuit including a first controller capable of performing a plurality of first state transitions, and a second controller capable of performing a plurality of second state transitions, the method comprising:
testing the functional behavior of said circuit;
determining, during said act of testing, for each pair of a first state transition and a second state transition performed simultaneously at least once, the number of times of said simultaneous performance, said number indicating a measure of the functional testing of said description of the circuit; and
generating descriptions of additional circuits that monitor portions of the circuit that are under testing, and during simulation each additional circuit is coupled to an instance of an arrangement of circuit elements associated with a known defective behavior, wherein the additional circuits monitor signals flowing to and from the instance and generate an error message on detecting the known defective behavior;
wherein each of said acts of testing, determining and generating is performed in said computer.

21. A method, implemented in a computer, of searching for functional defects in a description of a circuit with at least a controller capable of transitioning between a plurality of states, the method comprising:

simulating the functional behavior of said circuit in response to a first test vector, wherein the simulation has a current state, prior to said act of simulating;

restoring the simulation after said simulating act to said current state;

determining next states including a plurality of non-simulated states that can be reached from the current state;

simulating the functional behavior of said circuit in response to a second test vector, after said act of automatically restoring; and generating descriptions of additional circuits that monitor portions of the circuit that are under verification, and during simulation each additional circuit is coupled to an instance of an arrangement of circuit elements associated with a known defective behavior;

wherein the acts of simulating, restoring determining and generating are performed in said computer.

22. The method of claim 21, wherein the additional circuits monitor signals flowing to and from the instance and generate an error message on detecting the known defective behavior.

23. A method, implemented in a computer, of simulating a circuit description, the method comprising:

performing a first simulation for finding defects of said circuit description in response to a first test vector, wherein said circuit description has at least a controller capable of transitioning between a plurality of states and a current state prior to said first simulation;

restoring said first simulation to said current state after said first simulation;

determining next states including a plurality of non-simulated states that are reachable from the current state; and performing a second simulation of said circuit description in response to a second test vector, after said act of automatically restoring said first simulation, thereby facilitating a faster method of simulation;

wherein said acts of performing, restoring, and determining are all performed in said computer.

24. The method of claim 23, wherein said circuit description includes at least a first controller capable of performing a plurality of first state transitions and a second controller capable of performing a plurality of second state transitions, the method further comprising:

said computer enumerating for said first simulation and for said second simulation the number of times said first state transitions and said second state transitions occur simultaneously.

25. The method of claim 23 further comprising:

said computer applying a predetermined rule to identify said second test vector to transition from the current state to the next state, wherein the next state is a simulated or non-simulated state.

26. The method of claim 23 further comprising:

said computer enumerating said first state transition and said second state transition; and said computer applying a predetermined rule to identify said second test vector, wherein an input to said predetermined rule is at least one of said first and said second state transitions.

27. The method of claim 23, wherein said circuit description includes at least a first controller capable of performing a plurality of first state transitions and a second controller capable of performing a plurality of second state transitions, the method further comprising:

said computer enumerating for each of said simulating acts, the number of said first state transitions and said second state transitions occurring simultaneously; and said computer applying a predetermined rule to identify said second test vectors, wherein an input to said predetermined rule is at least one of said first and said second state transitions.

28. The method of claim 23, wherein said current state is generated by simulating said circuit description in response to a predetermined test vector.

29. The method of claim 23, wherein said circuit description includes at least one asynchronous clock signal, said asynchronous clock signal having a fist clock state when the simulation is in said current state, the method further comprising:

said computer setting the asynchronous clock signal to a second clock state different from said first clock state; wherein said act of setting is performed prior to said act of automatically restoring, and after said act of simulating with said first test vector.

30. The method of claim 23, wherein said method is repeated by said computer until all test vectors have been used in the simulation.

31. The method of claim 23, further comprising:

said computer restoring said second simulation to a state that is different from the current state; and said computer transitioning the simulation from the state different from the current state to the current state by using a sequence of test vectors identified by automatically applying a predetermined rule.

32. A method, implemented in a computer, of simulating a circuit description, the method comprising:

said computer converting said circuit description into a graph for finding functional defects;

said computer examining said graph for an instance of a predetermined pattern;

said computer simulating the functional behavior of said circuit description in response to a first test vector in a plurality of test vectors; wherein the simulation has a current state that is a non-reset state prior to said act of simulating;

said computer flagging, during said act of simulating, the functional behavior of said instance in violation of a rule associated with said predetermined pattern;

said computer restoring the simulation to said current state, said act of restoring being performed after said simulating act without causing the simulation to pass through a reset state; and said computer simulating the functional behavior of said circuit in response to a second test vector, after said act of automatically restoring, to produce a circuit design description.

33. The method of claim 32, wherein said circuit description includes a first controller capable of performing a plurality of first state transitions, and a second controller capable of performing a plurality of second state transitions, the method further comprising:

said computer determining, during each of said acts of simulating, for each pair of a first state transition and a second state transition performed simultaneously at least once, the number of times of said simultaneous performance, said number indicating a measure of the functional testing of said description.

34. A method, implemented in a computer, of simulating a circuit description, the method comprising:

performing inside said computer a first simulation of said circuit description in response to a first test vector;

said computer automatically restoring said first simulation to said current state after said first simulation;

determining inside said computer next states including a plurality of non-simulated states that are reachable from the current state; and performing inside said computer a second simulation of said circuit description in response to a second test vector, after said act of automatically restoring said first simulation.

35. The method of claim 34, wherein said circuit description includes at least one controller capable of transitioning between a plurality of states and a current state prior to said first simulation.

36. The method of claim 34, wherein said circuit description includes at least a first controller capable of performing a plurality of first state transitions and a second controller capable of performing a plurality of second state transitions, the method further comprising:

said computer enumerating for said first simulation and for said second simulation the number of times said first state transition and said second state transition occur simultaneously.

37. A method, implemented in a computer, of simulating a circuit description, the method comprising:

performing inside a computer a first simulation of said circuit description in response to a first test vector;

said computer restoring said first simulation to a current state after said first simulation;

said computer performing a second simulation from said current state, thereby facilitating a faster method of simulation; and said computer determining next states including a plurality of non-simulated states that are reachable from the current state.

38. A method, implemented in a computer, of simulating a circuit description, the method comprising:

performing inside a computer a first simulation of said circuit description in response to a first test vector;

said computer restoring said first simulation to a current state after said first simulation;

said computer performing a second simulation from said current state, thereby facilitating a faster method of simulation; and the computer performing a second simulation of said circuit description in response to a second test vector, after said act of automatically restoring said first simulation.

39. A method, implemented in a computer, of simulating a circuit description, the method comprising:

performing inside a computer a first simulation of said circuit description in response to a first test vector;

said computer restoring said first simulation to a current state after said first simulation;

said computer performing a second simulation from said current state, thereby facilitating a faster method of simulation;

wherein said circuit description includes at least one controller capable of transitioning between a plurality of states and a current state prior to said first simulation.

40. A method, implemented in a computer, of simulating a circuit description, the method comprising:

performing inside a computer a first simulation of said circuit description in response to a first test vector;

said computer restoring said first simulation to a current state after said first simulation;

said computer performing a second simulation from said current state, thereby facilitating a faster method of simulation;

wherein said circuit description includes at least a first controller capable of performing a plurality of first state transitions and a second controller capable of performing a plurality of second state transitions, the method further comprising:

wherein said computer enumerating for said first simulation and for said second simulation the number of times said first state transition and said second state transition occur simultaneously.

41. A method, implemented in a computer, of simulating a circuit description, the method comprising:

performing inside a computer a first simulation of said circuit description in response to a first test vector;

said computer restoring said first simulation to a current state after said first simulation;

said computer performing a second simulation from said current state, thereby facilitating a faster method of simulation;

wherein the method is performed to produce a circuit design description.

42. A method, implemented in a computer, for measuring the functional testing of a description of a circuit, said circuit including a first controller capable of performing a plurality of first state transitions, and a second controller capable of performing a plurality of second state transitions, the method comprising:

said computer generating descriptions of additional circuits to monitor portions of said circuit, and to flag behaviors of the portions if in conformance with known defective behaviors;

said computer testing the functional behavior of said circuit with a first controller performing a first state transition simultaneous with a second controller performing a second state transition; and automatically determining, during said act of testing, the number of times of said simultaneous performance, said number indicating a measure of the functional testing of said description of the circuit.

43. The method according to claim 42, wherein said known defective behaviors are specified by the user.

44. The method of claim 42, wherein, during said testing, the descriptions of said additional circuits are simulated along with the description of said circuit.

45. The method of claim 42, wherein at least one of the first controller and the second controller is a protocol controller.

46. A method of searching for functional defects in a description of a circuit with at least a controller capable of transitioning between a plurality of states, the method comprising:

automatically generating descriptions of additional circuits to monitor portions of said circuit, and to flag behaviors of the portions if in conformance with known defective behaviors;

using a programmed computer running a simulator program to simulate the functional behavior of said circuit in response to a test vector, wherein said circuit has a current circuit state after said act of simulating;

automatically reading the current circuit state from the simulator program; and automatically determining a plurality of non-simulated states of said controller that can be reached from the current circuit state.

47. The method according to claim 46, wherein said known defective behavior is specified by the user.

48. The method according to claim 46, further comprising automatically enumerating all states of said controller that can be reached from the current circuit state.

49. The method according to claim 46, further comprising recording in a computer memory a subset of simulated states of said controller.

50. The method according to claim 46, wherein said controller is a protocol controller.

51. A method of simulating a circuit description with at least a controller capable of transitioning between a plurality of states, the method comprising:

automatically converting said circuit description into a graph;

automatically examining said graph for an instance of a predetermined pattern;

simulating the functional behavior of said circuit description in response to a first test vector in a plurality of test vectors;

automatically recording in computer memory at least one of the states reached by said controller during said simulating;

using the state recorded in said recording and a predetermined rule to automatically identify a second test vector;

simulating the functional behavior of said circuit in a response to said second test vector; and automatically flagging, during said act of simulating, the functional behavior of said instance in violation of a rule associated with said predetermined pattern.

52. The method according to claim 51, wherein the predetermined pattern is specified by the user.

53. A method of simulating a circuit description, the method comprising:

performing in a computer a first simulation of said circuit description in response to a first test vector to reach a current state;

determining in a computer next states including a plurality of non-simulated states that are reachable from the current state;

performing in a computer a second simulation of said circuit description in response to a second test vector; and automatically flagging, during said second simulation, functional behavior of said circuit in violation of a predetermined rule.

54. The method according to claim 53, wherein said predetermined rule is specified by the user.

55. The method according to claim 53, further comprising using a computer to automatically traverse a representation of said circuit to determine a next state that is reachable from the current state.

56. The method according to claim 53, further comprising using a computer to automatically traverse a representation of said circuit backwards for a number of cycles determined by a budget measure to determine a next state that is reachable from the current state.

57. The method according to claim 53, further comprising recording in a computer memory a subset of states simulated.

58. A method of automatically searching for functional defects in a description of a circuit, the method comprising:

simulating the circuit using a test vector;

determining a measure of verification performed by simulation so far; and applying a predetermined rule, using as input said measure, to identify a plurality of next states, and to identify a test vector for transitioning to at least one of said plurality of next states.

59. The method of claim 58 further comprising:

simulating the circuit again, using the test vector identified during said applying.

60. The method of claim 58 further comprising, during said simulating:

automatically flagging error messages of simulation defects in said circuit.

61. The method of claim 60 wherein:

said automatic flagging is performed by simulation of automatically generated descriptions of additional circuits that monitor portions of said circuit.

62. The method of claim 58 wherein:

said circuit contains at least a controller capable of transitioning between a plurality of states and said measure of verification identifies the states of said controller that have been reached in simulation.

63. The method according to claim 62 further comprising:
automatically enumerating all states of said controller.

64. The method according to claim 62 further comprising:
recording in a computer memory a subset of simulated states of said controller.

65. The method of claim 62, wherein:
said measure of verification is used to minimize repetition of simulations that have already been performed.

66. The method according to claim 62 further comprising:
using a computer to automatically traverse a representation of said circuit to determine at least one next state.

67. The method of claim 62 further comprising:
automatically generating descriptions of additional circuits to monitor portions of said circuit, and to flag behaviors of the portions if in conformance with known defective behaviors.

68. The method of claim 67 wherein:
said known defective behaviors are specified by the user.

\* \* \* \* \*